(12) United States Patent
Martin et al.

(10) Patent No.: US 11,742,332 B2
(45) Date of Patent: Aug. 29, 2023

(54) METHODS AND SYSTEMS FOR MATCHING BOTH DYNAMIC AND STATIC PARAMETERS IN DIES, DISCRETES, AND/OR MODULES, AND METHODS AND SYSTEMS BASED ON THE SAME

(71) Applicant: Cree Fayetteville, Inc., Fayetteville, AR (US)

(72) Inventors: Daniel John Martin, Fayetteville, AR (US); William Austin Curbow, Fayetteville, AR (US)

(73) Assignee: WOLFSPEED, INC., Durham, NC (US)

( * ) Notice: Subject to any disclaimer, the term of this patent is extended or adjusted under 35 U.S.C. 154(b) by 578 days.

(21) Appl. No.: 16/706,028

(22) Filed: Dec. 6, 2019

(65) Prior Publication Data
US 2021/0175214 A1 Jun. 10, 2021

(51) Int. Cl.
| | | |
|---|---|---|
| *H01L 25/07* | (2006.01) | |
| *H01L 25/00* | (2006.01) | |
| *H01L 23/50* | (2006.01) | |
| *H01L 21/66* | (2006.01) | |
| *G01R 31/30* | (2006.01) | |
| *B07C 5/344* | (2006.01) | |

(52) U.S. Cl.
CPC ........ *H01L 25/072* (2013.01); *G01R 31/3004* (2013.01); *H01L 22/14* (2013.01); *H01L 23/50* (2013.01); *H01L 25/50* (2013.01); *B07C 5/344* (2013.01)

(58) Field of Classification Search
CPC .......... G01R 31/31702; G01R 31/2831; G01R 31/2648; G01R 31/26; G01R 31/2642
See application file for complete search history.

(56) References Cited

U.S. PATENT DOCUMENTS

| | | | | |
|---|---|---|---|---|
| 9,839,146 | B2* | 12/2017 | Cole | ........................ H01L 24/72 |
| 10,665,515 | B1 | 5/2020 | Klein et al. | |
| 11,538,725 | B2 | 12/2022 | Domes | |
| 2008/0034337 | A1 | 2/2008 | Kuemerle et al. | |
| 2011/0062491 | A1 | 3/2011 | Nakata | |
| 2016/0352101 | A1* | 12/2016 | Koo | ......................... H02J 1/12 |

(Continued)

FOREIGN PATENT DOCUMENTS

| | | |
|---|---|---|
| CN | 109712969 A | 5/2019 |
| JP | 2018-085858 A | 5/2018 |

(Continued)

OTHER PUBLICATIONS

International Search Report and Written Opinion issued in PCT/US2020/060823, dated Mar. 22, 2021.

(Continued)

*Primary Examiner* — Tung X Nguyen
(74) *Attorney, Agent, or Firm* — BakerHostetler

(57) ABSTRACT

A device binning and/or matching process includes measuring with a testing device currents and/or voltages of a device with respect to time, determining with the testing device binning and/or matching criteria for the device based on transfer data generated from the device currents and/or the voltages measured with respect to time, and outputting with the testing device the binning and/or matching criteria for the device. A system and power module are also disclosed.

22 Claims, 23 Drawing Sheets

(56) References Cited

U.S. PATENT DOCUMENTS

| | | |
|---|---|---|
| 2017/0104419 A1 | 4/2017 | Zeng et al. |
| 2017/0263535 A1 | 9/2017 | Nakano et al. |
| 2018/0206359 A1 | 7/2018 | McPherson et al. |
| 2019/0160494 A1 | 5/2019 | Linde et al. |

FOREIGN PATENT DOCUMENTS

| | | |
|---|---|---|
| JP | 2018-107857 A | 7/2018 |
| JP | 2018-107858 A | 7/2018 |
| WO | WO 2003/018346 A1 | 3/2003 |
| WO | WO 2021/033565 A1 | 2/2021 |

OTHER PUBLICATIONS

Li, "Parallel Connection of Silicon Carbide MOSFETs for Multichip Power Modules" Department of Energy Technology, Aalborg University, Denmark, 2015, 54 pages.

Hammadi et al.; "Layout Optimization of Power Modules Using a Sequentially Coupled Approach"; Int'l J Simul Model; vol. 10 No. 3; 2011; p. 122-132.

\* cited by examiner

Table 1. Threshold voltage and on-resistance of 8 random CAB450M12XM3 power modules.

| Device | Threshold | Rdson |
|---|---|---|
| 5967346040_SW1 | 2.9503 | 0.00299772 |
| 5967346040_SW2 | 2.79956 | 0.002750726 |
| E1852003_SW1 | 3.011 | 0.003134679 |
| E1852003_SW2 | 3.06856 | 0.002928095 |
| E1903001_SW1 | 2.77392 | 0.002737739 |
| E1903001_SW2 | 2.9065 | 0.002731167 |
| E1905001_SW1 | 2.99314 | 0.002867133 |
| E1905001_SW2 | 2.90372 | 0.002682795 |
| E1905002_SW1 | 2.91164 | 0.002780162 |
| E1905002_SW2 | 2.9566 | 0.002754334 |
| E1905010_SW1 | 2.8205 | 0.002696907 |
| E1905010_SW2 | 2.9103 | 0.002621459 |
| E1910002_SW1 | 3.0884 | 0.0031975 |
| E1910002_SW2 | 2.91492 | 0.002820415 |
| E1910003_SW1 | 3.12962 | 0.00324001 |
| E1910003_SW2 | 3.00802 | 0.002987313 |

FIG. 7

Table 2. Summary of losses for each test condition.

| Test Condition | $\dfrac{\Delta E_{OFF}}{E_{OFF}}$ | $\dfrac{\Delta E_{ON}}{E_{ON}}$ | $\Delta Conduction\ Loss\ (W)$ | $\dfrac{\Delta Conduction\ Loss}{Conduction\ Loss}$ |
|---|---|---|---|---|
| 1 (E1903001 and E1910002) | 4.62% | 0.10% | 21.69 | 2% |
| 2 (E1852003 and E1905010) | 13.18% | 5.56% | 139.8 | 10% |
| 3 (E1910002 and E1905010) | 9.61% | 0.40% | 69.00 | 5% |

FIG. 13

Table 3. Drain Current when VGS = 7 V for devices down-selected in test.

| Device | Current @ $V_{GS} = 7$ V (A) |
|---|---|
| E1852003 | 150.062 |
| E1910002 | 202.954 |
| E1903001 | 203.012 |
| E1905010 | 276.710 |

FIG. 15

METHODS AND SYSTEMS FOR MATCHING BOTH DYNAMIC AND STATIC PARAMETERS IN DIES, DISCRETES, AND/OR MODULES, AND METHODS AND SYSTEMS BASED ON THE SAME

BACKGROUND OF THE DISCLOSURE

Die binning is typically a categorizing of finished dies based on their characteristics. In order to undergo die binning, manufactured dies typically require testing. Die binning allows large variances in performance to be condensed into a smaller number of component groups. This ensures coherency in the groups of dies.

In this regard, die binning and matching is typically required for multi-chip devices, such as power modules, to ensure maximum sharing of losses between die. Loss mechanisms are typically characterized as both static and dynamic in nature. Presently, on-state resistance or threshold voltage are used as matching criteria in the industry. However, on-state resistance only captures static loss mechanisms, and threshold voltage is utilized as a method of matching dynamic loss mechanisms.

SUMMARY OF THE DISCLOSURE

One general aspect includes a device binning and/or matching process including: measuring with a testing device currents and/or voltages of a device with respect to time, determining with the testing device binning and/or matching criteria for the device based on transfer data generated from the device currents and/or the voltages measured with respect to time, and outputting with the testing device the binning and/or matching criteria for the device.

One general aspect includes a system configured for device binning and/or matching including: at least one testing device configured to measure currents and/or voltages of a device with respect to time, the at least one testing device configured to determine binning and/or matching criteria for the device based on transfer data generated from the device currents and/or the voltages measured with respect to time, and the at least one testing device configured to output the binning and/or matching criteria for the device based on the transfer data.

One general aspect includes a process of configuring a power module, including: providing at least one power substrate, arranging a housing on the at least one power substrate, selecting a plurality of power devices based on at least transfer data of the plurality of power devices, and electrically connecting the plurality of power devices to the at least one power substrate.

One general aspect includes a power module, including: at least one electrically conductive power substrate, a housing arranged on the at least one electrically conductive power substrate, and a plurality of power devices arranged on and connected to the at least one electrically conductive power substrate. The power module also includes where each plurality of power devices includes a first device characterization based on data characterizing both static and dynamic losses of each plurality of power devices within a predetermined range.

One general aspect includes a device binning and/or matching process including: applying with a testing device voltages and/or currents to a device, sweeping or varying with the testing device an application of voltages and/or currents to the device, measuring with the testing device currents and/or voltages of the device with respect to time, generating with the testing device transfer data based on the device currents and/or the voltages with respect to time, selecting and comparing with the testing device at least one operating point of the transfer data to obtain a first device characterization, determining with the testing device binning and/or matching criteria for the device based on the first device characterization, and outputting with the testing device the binning and/or matching criteria for the device based on the first device characterization, where the device includes one of the following: a die for a multi-chip device and a multi-chip device.

One general aspect includes a system configured for device binning and/or matching including: at least one testing device configured to apply voltages and/or currents to a device, the at least one testing device configured to sweep or vary application of voltages and/or currents to the device, the at least one testing device configured to measure currents and/or voltages of the device with respect to time, the at least one testing device configured to generate transfer data based on the device currents and/or the voltages with respect to time, the at least one testing device configured to select and compare at least one operating point of the transfer data to obtain a first device characterization, the at least one testing device configured to determine binning and/or matching criteria for the device based on the first device characterization, and the at least one testing device configured to output the binning and/or matching criteria for the device based on the first device characterization, where the device includes one of the following: a die for a multi-chip device and a multi-chip device.

One general aspect includes a process of configuring a power module, including: providing at least one power substrate, arranging a housing on the at least one power substrate, electrically connecting a first terminal to the at least one power substrate, providing a second terminal, electrically connecting a third terminal to the at least one power substrate, providing a base plate, selecting a plurality of power devices based a first device characterization of each of the plurality of power devices based on at least transfer data of the plurality of power devices, and electrically connecting the plurality of power devices to the at least one power substrate.

One general aspect includes a power module, including: at least one electrically conductive power substrate, a housing arranged on the at least one electrically conductive power substrate, a first terminal electrically connected to the at least one electrically conductive power substrate, a second terminal, a third terminal electrically connected to the at least one electrically conductive power substrate, a base plate, and a plurality of power devices arranged on and connected to the at least one electrically conductive power substrate. Where each plurality of power devices includes a first device characterization based on at least transfer data of each plurality of power devices within a predetermined range.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 7 illustrates a Table 1 presenting data on threshold voltage and on-resistance of eight random power modules.

FIG. 13 illustrates a Table 2 listing a summary of losses for each test condition.

FIG. 15 illustrates a Table 3 listing drain current at a particular gate-source voltage ($V_{GS}$) for devices down-selected for testing.

DETAILED DESCRIPTION OF THE DISCLOSURE

Figure 1:
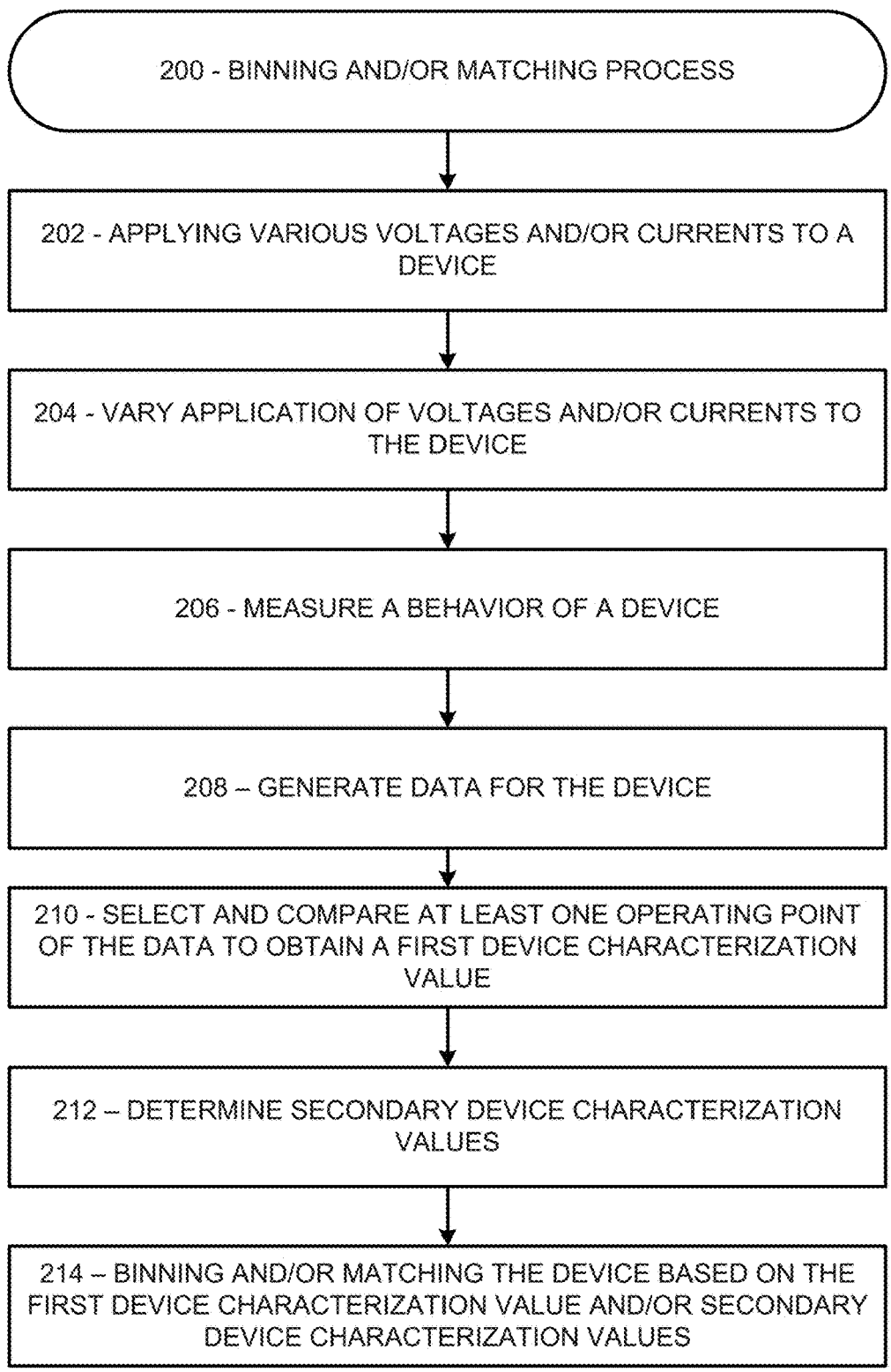
FIG. 1 illustrates a process according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

This disclosure is directed to a method for matching both dynamic and static parameters in dies, discretes, and/or modules. This disclosure is further directed to a system for matching both dynamic and static parameters in dies, discretes, and/or modules. This disclosure is further directed to modules constructed based on a method for matching both dynamic and static parameters in dies, discretes, and/or modules. This disclosure is further directed to modules constructed based on a system for matching both dynamic and static parameters in dies, discretes, and/or modules. This disclosure is further directed to systems constructed based on a method for matching both dynamic and static parameters in dies, discretes, and/or modules. This disclosure is further directed to systems constructed based on a system for matching both dynamic and static parameters in dies, discretes, and/or modules. This disclosure is further directed to a matching both dynamic and static parameters in dies, discretes, and/or modules utilizing a limited number of parameters.

Die binning and matching may be highly beneficial to ensure maximum sharing of losses between die, even current distribution, consistent performance, uniform temperature, and the like. Moreover, die binning and matching may be highly beneficial for multi-chip devices to ensure maximum sharing of losses between die, even current distribution, consistent performance, uniform temperature, and the like. Additionally, die binning and matching may be highly beneficial for systems of multi-chip devices to ensure maximum sharing of losses between die and/or the multi-chip devices, even current distribution, consistent performance, uniform temperature, and the like. For example, multi-chip devices such as power modules and the like and systems of multi-chip devices.

As described above, typical loss mechanisms are both static and dynamic in nature. Approaches can utilize on-state resistance or threshold voltage as matching criteria. However, on-state resistance only captures static loss mechanisms, and threshold voltage is utilized as a method of matching dynamic loss mechanisms. Moreover, there is no clear definitive correlation between the on-state resistance and the threshold voltage. Accordingly, it is impractical to use these parameters to ensure accurate matching.

Accordingly, what is needed is a method and system for more accurately determining and matching both dynamic and static parameters in dies, discretes, and modules. Moreover, what is needed is multichip devices configured with dies that are accurately matched for both dynamic and static parameters. Additionally, what is needed is a system of multichip devices that are accurately matched for both dynamic and static parameters.

The disclosed methods and systems address the limitations of the previous approaches by utilizing alternative device characteristics, such as the characteristics described herein. In one aspect, the disclosed method and system utilizes characteristics that include characteristics provided by a device transfer curve, a transfer function, data representative of an independent scalar input versus a dependent scalar output, and/or the like. In one aspect, the disclosed method and system utilizes characteristics of the die consistent with a device transfer curve, a transfer function, data representative of an independent scalar input versus a dependent scalar output, and/or the like.

In one aspect, the disclosed method and system utilizes characteristics that include characteristics provided by a device transfer curve, a transfer function, data representative of an independent scalar input versus a dependent scalar output, and/or the like in addition to other characteristics. In one aspect, the disclosed method and system utilizes characteristics of the die consistent with a device transfer curve, a transfer function, data representative of an independent scalar input versus a dependent scalar output, and/or the like in addition to other characteristics. In this regard, the disclosure presents a method and/or system to capture both static and dynamic loss mechanisms more accurately.

In one aspect, the disclosure presents a method and/or system to capture both static and dynamic loss mechanisms more accurately utilizing a limited number of criteria. In one aspect, the disclosure presents a method and/or system to capture both static and dynamic loss mechanisms more accurately in a single criterion. In this regard, the disclosure provides analysis and support for utilizing a device transfer curve, a transfer function, data representative of an independent scalar input versus a dependent scalar output, and/or the like of dies. Moreover, the disclosure sets forth and supports that a device transfer curve, a transfer function, data representative of an independent scalar input versus a dependent scalar output, and/or the like provides a highly accurate method to ensure substantially equal or equal current sharing between paralleled dies, discretes, and devices utilizing the same such as power modules, and/or systems implementing the same.

In one aspect, a limited number of points in a device transfer curve, a transfer function, data representative of an independent scalar input versus a dependent scalar output, and/or the like may be utilized to provide simple and accurate matching. In one aspect, a single point in the transfer curve may be utilized to provide simple and accurate matching.

In one aspect, a limited number of points in a device transfer curve, a transfer function, data representative of an independent scalar input versus a dependent scalar output, and/or the like may be utilized in addition to other characteristics to provide simple and accurate matching. In one aspect, a single point in a device transfer curve, a transfer function, data representative of an independent scalar input versus a dependent scalar output, and/or the like in addition to other characteristics may be utilized to provide simple and accurate matching.

As described above, present binning methods use either on-state resistance or threshold voltage, which represent static and dynamic matching conditions respectively. However, there is no clear correlation between on-state resistance and threshold voltage. Accordingly, use of these parameters individually and/or combined to ensure matching of both static and dynamic testing results in poor matching.

The disclosed method and system utilizes a device transfer curve, a transfer function, data representative of an independent scalar input versus a dependent scalar output, and/or the like of devices to meld and moreover enhance these two parameters, as well as others, and offers substantially improved matching of both static and dynamic parameters.

The disclosed method and system utilizes a binning method that may minimize derating and/or may maximize reliability by ensuring loss may be distributed equally among parallel devices reducing a tendency for thermal mismatch, runaway, and the like. The disclosed method and system may be utilized to deliver customer-matched components, such as power modules, which can be used to realize scalable architectures, such as power module architectures and/or multiple power modules operating in parallel, and/or systems implementing the same.

In this regard, multi-chip devices, such as power modules and the like, may utilize multiple dies in parallel to achieve higher current levels. To maximize the ampacity of the multi-chip devices, such as power modules, all die in multi-chip devices should beneficially behave in a similar fashion. The disclosed method and system utilizes a binning method that ensures all die in multi-chip devices generally behave in a similar fashion.

More specifically, the method and system of the disclosure ensures key loss mechanisms can be more accurately matched such that each die in the multi-chip device, such as a power module, may be at or near the same temperature and/or sharing losses equally.

FIG. 1 illustrates a process of binning and/or matching according to the disclosure.

In particular, FIG. 1 illustrates a binning and/or matching process 200. In this regard, the binning and/or matching process 200 may be applied to each die for a multi-chip device, such as a power module. Moreover, the binning and/or matching process 200 may be applied to each multi-chip device, such as a power module, for multiple multi-chip device implementations of multi-chip devices and systems implementing the same. In one aspect, the binning and/or matching process 200 may be applied to each die; and subsequently the binning and/or matching process 200 may be applied to each multi-chip device utilizing a plurality of dies for multiple multi-chip device implementations.

In this regard, the binning and/or matching process 200 may be implemented for each die for a multi-chip device after manufacture of a die. Additionally, the binning and/or matching process 200 may be implemented for each multi-chip device after manufacture of the multi-chip device. Alternatively, the binning and/or matching process 200 may be implemented only for each die for a multi-chip device after manufacture of a die. Alternatively, the binning and/or matching process 200 may be implemented only for each multi-chip device after manufacture of the multi-chip device.

Figure 2:
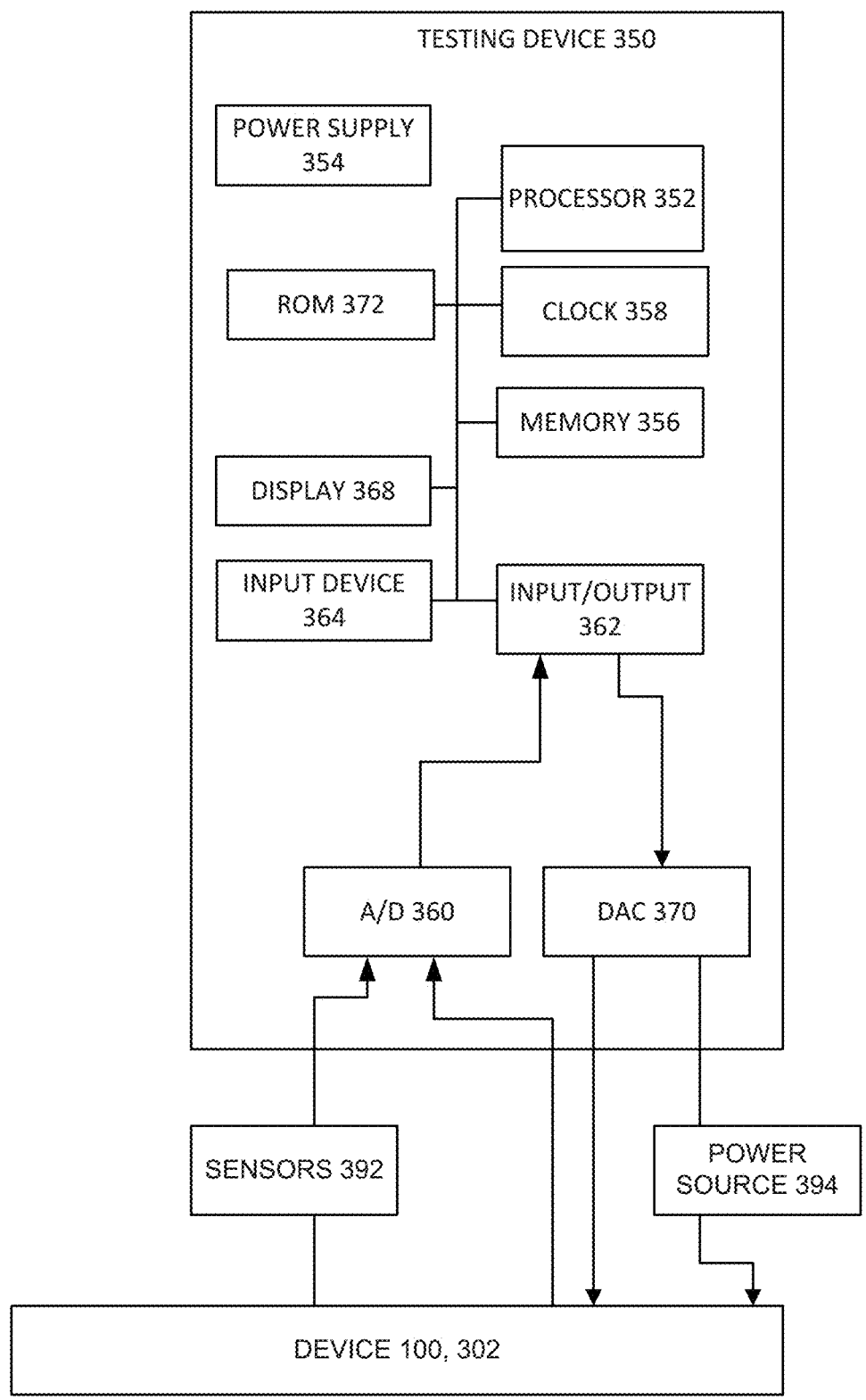
FIG. 2 illustrates a device utilized at least in part for the process according to the disclosure.

The binning and/or matching process 200 may be implemented with a testing device as described in further detail with respect to FIG. 2. In this regard, the binning and/or matching process 200 in conjunction with the testing device may operate the device by applying various voltages and/or currents to the device as illustrated in box 202.

In one aspect, the binning and/or matching process 200 in conjunction with the testing device may turn-on the device. In one aspect, the binning and/or matching process 200 in conjunction with the testing device may turn-on the device by applying a gate voltage. In one aspect, the binning and/or matching process 200 in conjunction with the testing device may turn-on the device by applying a gate voltage such that the device may start conducting significant current. In this regard, the device may be a die for a multi-chip device and/or a multi-chip device.

More specifically, the testing device may be electrically connected to one or more of a gate, a source, a drain, and the like of the device. Accordingly, the testing device may operate the device by applying various voltages and/or currents to the device as illustrated in box 202. In this regard, the testing device may include at least one power source having at least one controllable voltage and/or current output that may operate the device by applying various voltages and/or currents to the device as illustrated in box 202. Moreover, the testing device may include at least one sensor, such as a current sensor, a voltage sensor, and the like to measure and determine various characteristics of the device including physical quantities such as device resistances (e.g., gate resistance), device capacitances, device resonant points, and/or the like.

The binning and/or matching process 200 may in conjunction with the testing device may vary application of voltages and/or currents to the device as illustrated in box 204. In one aspect, the binning and/or matching process 200 may in conjunction with the testing device may sweep or vary application of a voltage to the device. In one aspect, the binning and/or matching process 200 may in conjunction with the testing device may sweep or vary a gate voltage applied to the device. In one aspect, the binning and/or matching process 200 may in conjunction with the testing device may sweep or vary a gate voltage applied to the device over a very short time. In one aspect, the binning and/or matching process 200 may in conjunction with the testing device may sweep or vary a gate voltage over a short time while the device starts to conduct current. In one aspect, the sweeping or varying of a gate voltage may be in a range based on design parameters such as a defined fraction of a defined on/off voltage range. In one aspect, the sweeping or varying of a gate voltage may be in a range of 1 V to 20V, 1 V to 2V, 2V to 3V, 3V to 4V, 4V to 5V, 5V to 6V, 6V to 7V, 7V to 8V, 8V to 9V, 9V to 10V, 10V to 12V, 12V to 14V, 14V to 16 V, 16 V to 18 V, or 18 V to 20 V. In one aspect, the short time period may be a time that is sufficient enough to balance a settling time for a measurement and limit self-heating. For example, the short time period may be 10 μs to 500 μs, 10 μs to 50 μs, 50 μs to 100 μs, 100 μs to 200 μs, 200 μs to 300 μs, 300 μs to 400 μs, or 400 μs to 500 μs. In one or more aspects, the binning and/or matching process 200 may in conjunction with the testing device may test a device under switching conditions. In one or more aspects, the binning and/or matching process 200 may in conjunction with the testing device may test a device under switching conditions, where a gate-source voltage ($V_{GS}$) may be actuated dynamically.

In one or more aspects, the binning and/or matching process 200 may operate by turning the device on such that the gate may be stepped from an off-state to an on-state over a finite time duration. In one aspect, the off-state may be −4 volts (V) to −5 V; the on-state may be 15 V to 20 V; and the finite time duration may be a time that is sufficient enough to balance a settling time for a measurement and limit self-heating. For example, the finite time duration may be 10 μs to 500 μs, 10 μs to 50 μs, 50 μs to 100 μs, 100 μs to 200 μs, 200 μs to 300 μs, 300 μs to 400 μs, or 400 μs to 500 μs. However, other off-state voltages, other on-state voltages, and other finite time durations may be utilized as well.

The binning and/or matching process 200 may in conjunction with the testing device may measure a behavior of the device as illustrated in box 206. In one aspect, the binning and/or matching process 200 may in conjunction with the testing device may measure various device currents and/or voltages. In one aspect, the binning and/or matching process 200 may in conjunction with the testing device may measure various device currents and/or voltages with respect to time. In one aspect, the binning and/or matching process 200 may in conjunction with the testing device may measure a turn-on drain current ($I_D$) of the device with respect to time. In one aspect, the binning and/or matching process 200 may in conjunction with the testing device may measure a gate-source voltage ($V_{GS}$) with respect to time. In one aspect, the binning and/or matching process 200 may in conjunction with the testing device may measure a turn-on drain current ($I_D$) of the device with respect to time and a gate-source voltage ($V_{GS}$) with respect to time, and the like.

The binning and/or matching process 200 may in conjunction with the testing device may generate transfer data, such as a device transfer curve, a transfer function, data representative of an independent scalar input versus a dependent scalar output, parametric data, data characterizing both static and dynamic losses, and/or the like as illustrated in box 208.

In one aspect, the binning and/or matching process 200 may in conjunction with the testing device generate transfer data, such as a device transfer curve, a transfer function, data representative of an independent scalar input versus a dependent scalar output, time domain waveforms, parametric data, data characterizing both static and dynamic losses, and/or the like of the gate-source voltage ($V_{GS}$) for the device. In one aspect, the binning and/or matching process 200 may in conjunction with the testing device may generate transfer data, such as a device transfer curve, a transfer function, data representative of an independent scalar input versus a dependent scalar output, time domain waveforms, parametric data, data characterizing both static and dynamic losses, and/or the like of the drain-source current ($I_{DS}$) for the device. In one aspect, the binning and/or matching process 200 may in conjunction with the testing device may generate transfer data, such as a device transfer curve, a transfer function, data representative of an independent scalar input versus a dependent scalar output, time domain waveforms, parametric data, data characterizing both static and dynamic losses, and/or the like of the gate-source voltage ($V_{GS}$) and the drain-source current ($I_{DS}$) for the device.

In one aspect, the binning and/or matching process 200 may in conjunction with the testing device may generate transfer data, such as a device transfer curve, a transfer function, data representative of an independent scalar input versus a dependent scalar output, time domain waveforms, parametric data, data characterizing both static and dynamic losses, and/or the like of at least one voltage and/or current for the device. In one aspect, the binning and/or matching process 200 may in conjunction with the testing device may generate transfer data, such as a device transfer curve, a transfer function, data representative of an independent scalar input versus a dependent scalar output, time domain waveforms, parametric data, data characterizing both static and dynamic losses, and/or the like of the gate-source voltage ($V_{GS}$) for the device. In one aspect, the binning and/or matching process 200 may in conjunction with the testing device generate transfer data, such as a device transfer curve, a transfer function, data representative of an independent scalar input versus a dependent scalar output, time domain waveforms, parametric data, data characterizing both static and dynamic losses, and/or the like of the drain-source current ($I_{DS}$) for the device. In one aspect, the binning and/or matching process 200 may in conjunction with the testing device may generate transfer data, such as a device transfer curve, a transfer function, data representative of an independent scalar input versus a dependent scalar output, time domain waveforms, parametric data, data characterizing both static and dynamic losses, and/or the like of the gate-source voltage ($V_{GS}$) and the drain-source current ($I_{DS}$) for the device.

The binning and/or matching process 200 may in conjunction with the testing device may select and compare at least one operating point of the transfer data to obtain a first device characterization value as illustrated in box 210. The transfer data including one or more a device transfer curve, a transfer function, data representative of an independent scalar input versus a dependent scalar output, time domain waveforms, parametric data, data characterizing both static and dynamic losses, and/or the like.

In one aspect, the binning and/or matching process 200 may in conjunction with the testing device may select and compare at least one operating point of a time-domain-generated voltage vs. current to obtain a first device characterization value. In one aspect, the binning and/or matching process 200 may in conjunction with the testing device may select and compare one operating point of the time-domain-generated gate-source voltage ($V_{GS}$) vs. drain-source current ($I_{DS}$) to obtain a first device characterization value.

In this regard, the device may be characterized with a predetermined gate-source voltage ($V_{GS}$) to obtain a first device characterization value. The predetermined gate-source voltage ($V_{GS}$) may be 1 V to 20 V, 1 V to 2V, 2V to 3V, 3V to 4V, 4V to 5V, 5V to 6V, 6V to 7V, 6V to 8V, 8V to 9 V, 9V to 10V, 10V to 11 V, 11 V to 12V, 12V to 14V, 14V to 16V, 16V to 18 V, or 18 V to 20 V.

The testing device may be implemented with curve tracer functionality that may be programmed to take a limited number of total data points to ensure stability of the results. In one aspect, the limited number of total data points may be 2-20, 2-4, 4-6, 6-8, 8-10, 10-12, 12-14, 14-16, 16-18, or 18-20.

In one aspect, utilizing the method and system of the disclosure, a limited number of operating points on the transfer curve may be selected to obtain a first device characterization value. Thereafter, the limited number of values may be utilized for binning and/or matching. More specifically, a limited number of operating points on the transfer curve may be selected representing currents for each device may be selected.

The limited number of operating points on the transfer curve representing currents may be utilized or binning and or matching devices. More specifically, devices exhibiting operating points on the transfer curve representing currents that are within a predetermined range may be selected as binning and or matching devices. For example, a bin may be defined by a calculation based on N number of discreate measurements on the transfer curve. The calculation may utilize a binning algorithm that may be a weighted average, multiple integrations, combinations of factors, and/or the like.

In one aspect, utilizing the method and system of the disclosure, a single operating point on the transfer curve may be selected. Thereafter, the single value can be utilized for binning and or matching. More specifically, a single operating point on the transfer curve may be selected representing a current or current range for each device may be selected.

The single operating point on the transfer curve representing current may be utilized for binning and/or matching devices. More specifically, devices exhibiting an operating point on the transfer curve representing a current that are within a predetermined range may be selected as binning and or matching devices.

The predetermined range may be 0 amps to 40 amps, 0 amps to 10 amps, 0 amps to 20 amps, 0 amps to 30 amps, or 0 amps to 40 amps. The predetermined range may be 0% to 20% of the current, 0% to 5% of the current, 0% to 10% of the current, 0% to 15% of the current, or 0% to 20% of the current.

Additionally, the predetermined range or width of the bin may be determined on several criteria such as die distribution, volume of product, and the like such that the binning ensures generally consistent dynamic losses and static losses.

The binning and/or matching process 200 may in conjunction with the testing device may determine secondary device characterization values as illustrated in box 212. In this regard, the secondary device characterization values may include one or more of an anticipated implementation location of the device, an anticipated implementation temperature of the device, an anticipated implementation configuration of the device, an anticipated implementation voltage of the device, an anticipated implementation current of the device, an anticipated implementation environment of the device, an anticipated implementation humidity of the device, an anticipated number of the devices implemented, an anticipated implementation location of the device, an anticipated implementation position of the device, and the like. In this regard, anticipated implementation features of the device in a multiple device configuration may vary greatly and generating a secondary device characterization based on this information may result in even more accurate binning.

The binning and/or matching process 200 may in conjunction with the testing device may determine binning and/or matching of the device based on the first device characterization value and/or secondary device characterization values as illustrated in box 214.

In this regard, the binning and/or matching process 200 may in conjunction with the testing device may determine binning and/or matching of the device based on the first device characterization value and/or secondary device characterization values.

In one aspect, the binning and/or matching process 200 may in conjunction with the testing device may determine binning and/or matching of the device based on the first device characterization value only. In one aspect, the binning and/or matching process 200 may in conjunction with the testing device may determine binning and/or matching of the device based on the first device characterization value and secondary device characterization values.

In one aspect, the binning and/or matching process 200 may in conjunction with the testing device may determine binning and/or matching of the device based on the first device characterization value and secondary device characterization values where the first device characterization value is weighted with a first value and the secondary device characterization values is weighted with a second value. In one aspect, the first value is different from the second value. In one aspect, the first value is the same as the second value. In one aspect, the first value is greater than the second value. In one aspect, the first value is less than the second value.

In one aspect, the binning and/or matching process 200 may in conjunction with the testing device determine binning and/or matching criteria of the device and may output various binning and/or matching criteria to an output device such as a display, a printer, or the like. In one aspect, the binning and/or matching process 200 may in conjunction with the testing device determine binning and/or matching of the device and may store various binning and/or matching criteria to a memory, a database, or the like. Finally, the various binning and/or matching criteria may be utilized in manufacturing and/or configuring multiple die devices, multiple multi-die devices, systems implementing the same, and the like.

The binning and/or matching process 200 may alternatively and/or further utilize artificial intelligence and/or machine learning to compare the transfer data including one or more a device transfer curve, a transfer function, data representative of an independent scalar input versus a dependent scalar output, time domain waveforms, parametric data, data characterizing both static and dynamic losses, and/or the like and perform matching. The artificial intelligence and/or machine learning may utilize any number of approaches including one or more of cybernetics and brain simulation, symbolic, cognitive simulation, logic-based, anti-logic, knowledge-based, sub-symbolic, embodied intelligence, computational intelligence and soft computing, machine learning and statistics, and the like.

FIG. 2 illustrates a testing device utilized at least in part for the process according to the disclosure.

In particular, FIG. 2 illustrates the testing device 350 for use with various aspects of the disclosure. The testing device 350 may be implemented as a mechanical probe station, a curve tracer implemented with curve tracer functionality, and the like. The testing device 350 may be used to physically acquire signals from the internal nodes of the device.

The testing device 350 may utilize connectors, manipulators, or the like, which may allow a connection to the device. In one aspect, the connectors and/or manipulators may include the connectors implemented as needles that may be positioned in relation to the device for capturing voltages and/or currents, to a gate, a source, and/or a drain. Moreover, the connectors and/or manipulators that may include the connectors may be positioned in relation to the device for applying voltages and/or currents to the gate, the source, and/or the drain of the device.

The testing device 350 may include a processor 352, a memory 356, a display 368, a power supply 354, a read-only memory 372, an input device 364, an input/output device 362, an analog-to-digital converter 360, a digital to analog converter 370, a clock 358, one or more sensors 392, a power source 394, and the like. The processor 352 may be configured to process at least in part test functions, provide other test services, implement the binning and/or matching process 200, and the like. In one aspect, the testing device 350 may be implemented as a source measure unit (SMU), which may be capable of both sourcing input to the device and measuring output from the device.

The power source 394 may be configured as a highly stable DC power source, a constant current source, a constant voltage source, a variable current source, a variable voltage source, and/or the like. In one aspect, the testing device 350 in conjunction with the power source 394 may include sweep capabilities. The sweep capabilities may be configured to test the device under a range of conditions with different sources, different voltages, different currents, different time periods, different delays, and the like. The sweep capabilities may include fixed level current sweeps, fixed level voltage sweeps, linear sweeps, logarithmic sweeps, pulsed sweeps, and the like. The one or more sensors 392 may measure various device characteristics. Moreover, the one or more sensors 392 may measure various device characteristics during a sweeping function.

The testing device 350 may implement instrument integration, communication, test protocols, test time, and/or the like by utilizing an on-board script processor. The testing device 350 may allow user-defined on-board script execution for controlling test sequencing, test flow, decision making, instrument autonomy, implementation of the binning and/or matching process 200, and the like. The testing device 350 may include contact check functionality to verify good connections to the device under test before the test begins.

Additionally, the testing device 350 may implement an operating system, a touchscreen controller, a communications component, a graphics component, a contact/motion component, and the like to provide full functionality. In particular, the processor 352 may be configured to execute a software application configured to control the testing device 350 such as the binning and/or matching process 200 as described herein.

In one aspect, the software application may be configured to interact with the one or more sensors 392 and the like as described herein. In particular, the one or more sensors 392 may provide signals to the processor 352. The one or more sensors 392 may include one or more current sensors, one or more voltage sensors, and the like.

The testing device 350 may implement a testing protocol that may include the binning and/or matching process 200. The testing protocol may determine particular voltage levels, current amounts, time periods, and the like for the delivery to the device. The testing device 350 may be configured to utilize outputs from the one or more sensors 392 to adjust the current, voltage, and/or the like provided by power source 394 in conjunction with the binning and/or matching process 200.

The testing device 350 may determine binning and/or matching criteria of the device and may output various binning and/or matching criteria to an output device such as a display, a printer, or the like. In one aspect, the testing device 350 may determine binning and/or matching of the device and may store various binning and/or matching criteria to a memory, a database, or the like. Finally, the various binning and/or matching criteria may be utilized in manufacturing and/or configuring multiple die devices, multiple multi-die devices, and the like.

As further described below, FIGS. 4-16 provide specific exemplary background and implementations of the disclosure.

Typically, to match static and dynamic losses, both on-resistance ($R_{DS-On}$) and threshold voltage ($V_{TH}$) should be matched. However, attempting to match devices based on these parameters results in poor matching since the relationship between threshold voltage ($V_{TH}$) and on-resistance ($R_{DS-On}$) does not have a strong correlation.

Therefore, the method and system of the disclosure as described herein utilizes values and/or a single value as a binning and/or matching criteria that effectively captures the static and dynamic device performance.

In this regard, threshold voltage ($V_{TH}$) does not effectively quantify a predicted switching behavior of a device. One issue is that threshold voltage ($V_{TH}$) may be specified at an extremely low current. In this regard, the low current is typically 10 s of milliamps (mA). This extremely low current does not accurately capture how the devices will behave with 10 s, 100 s, or more amps of current conduction.

Figure 3:
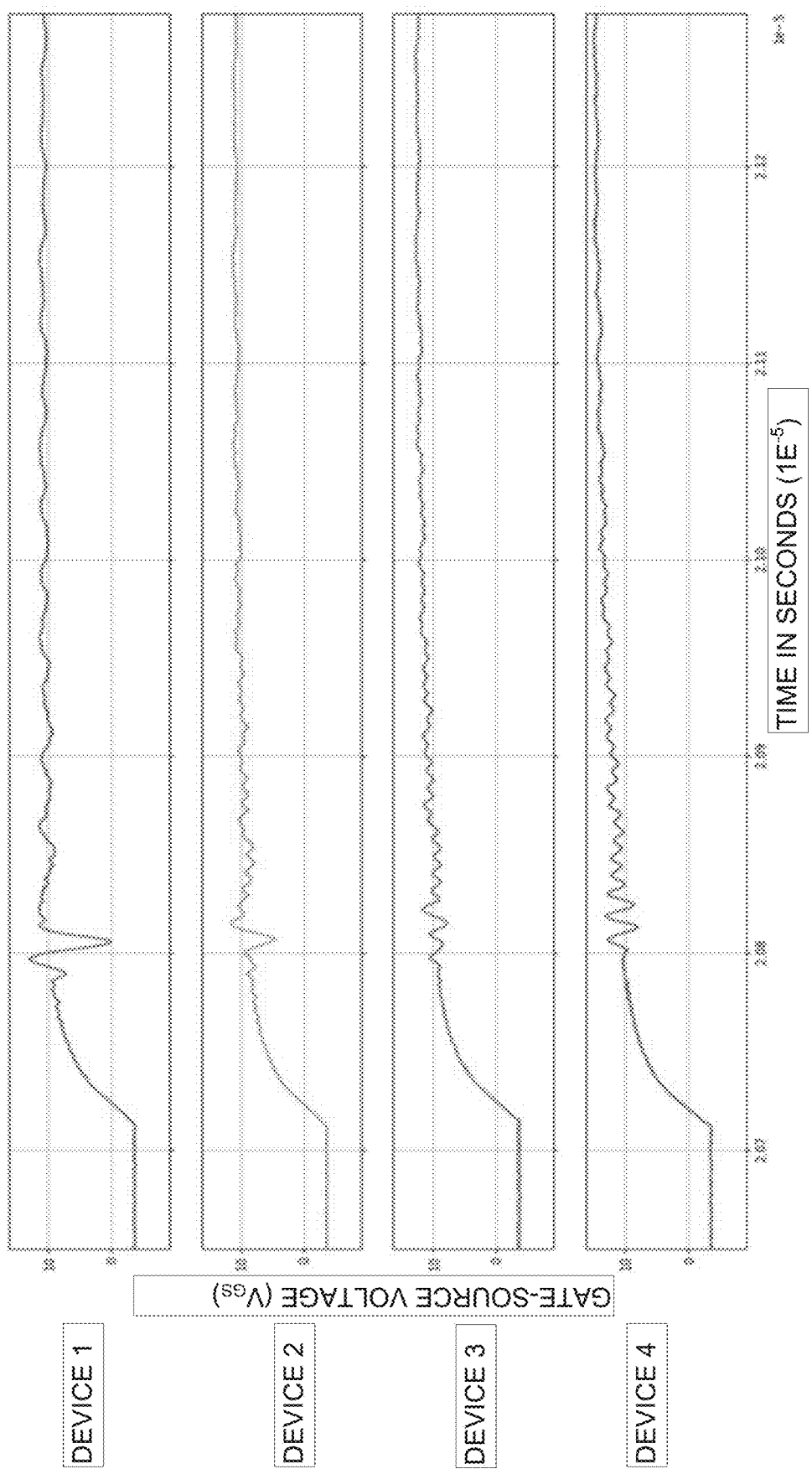
FIG. 3 illustrates typical gate-source voltage ($V_{GS}$) waveforms under turn-on conditions for various devices.

FIG. 3 illustrates typical gate-source voltage ($V_{GS}$) waveforms under turn-on conditions for various devices.

In particular, FIG. 3 illustrates four different gate-source voltage ($V_{GS}$) waveforms under turn-n conditions for various gate and source resistors indicated as DEVICE 1, DEVICE 2, DEVICE 3, AND DEVICE 4. The vertical axis or y-axis presenting gate-source voltage ($V_{GS}$); and the horizontal axis or x-axis presenting time in seconds ($1e^{-5}$).

The method and system of the disclosure may test a device under switching conditions, where the gate-source voltage ($V_{GS}$) may be actuated dynamically. Moreover, when turning the device on, the gate may be stepped from an off-state to an on-state over a finite time duration. In one aspect, the off-state may be −4 volts (V) to −5 V; the on-state may be 15 V to 20 V; and the finite time duration may be a time that is sufficient enough to balance a settling time for a measurement and limit self-heating. For example, the finite time duration may be 10 μs to 500 μs, 10 μs to 50 μs, 50 μs to 100 μs, 100 μs to 200 μs, 200 μs to 300 μs, 300 μs to 400 μs, or 400 μs to 500 μs. However, other off-state voltages, other on-state voltages, and other finite time durations may be utilized as well.

Figure 4:
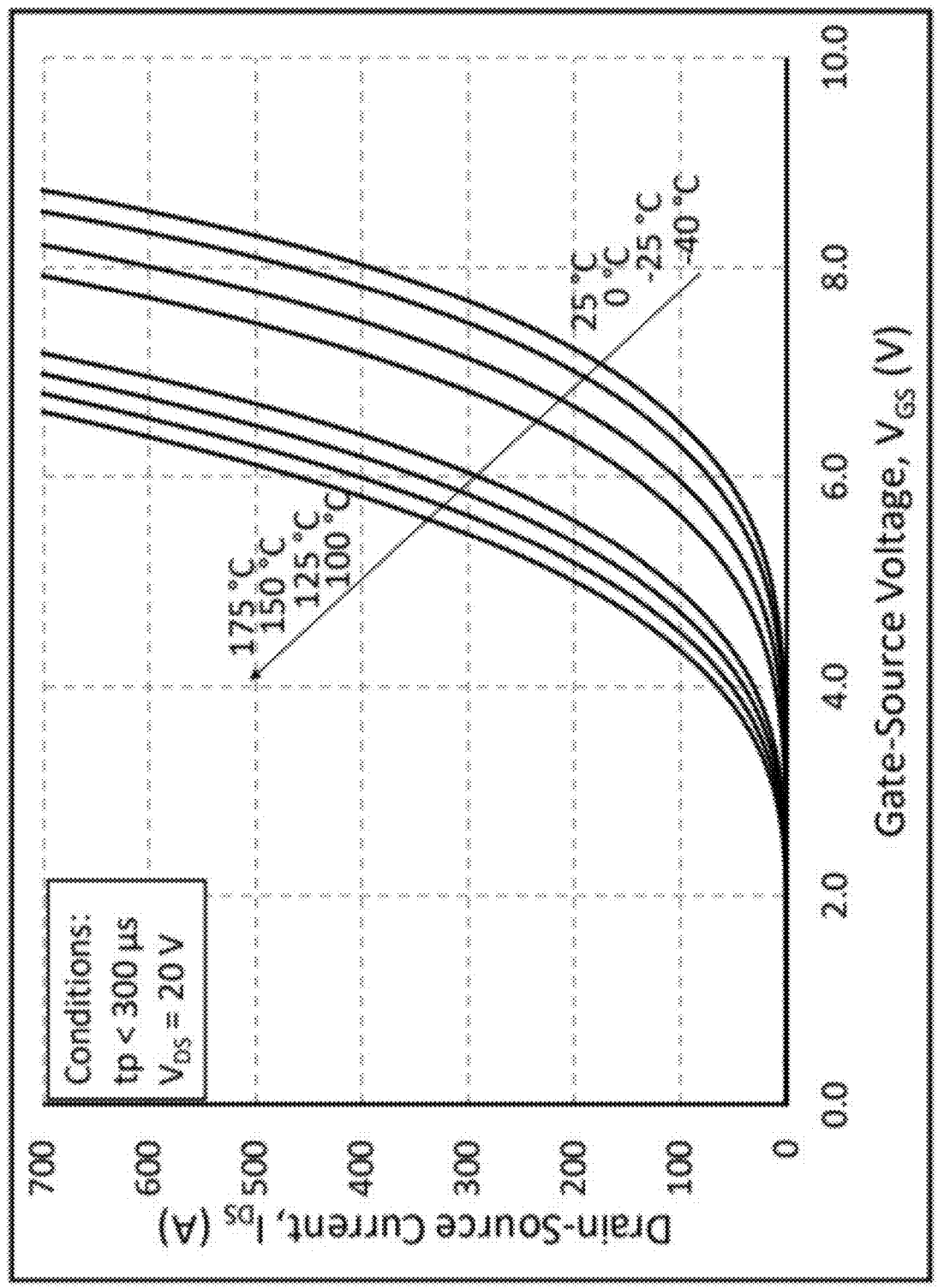
FIG. 4 illustrates an exemplary datasheet of transfer curves for a power module.

FIG. 4 illustrates an exemplary datasheet of transfer curves for a power module.

In particular, FIG. 4 illustrates a drain-source current ($I_{DS}$) in amps (A) along a vertical or y-axis; and FIG. 4 further illustrates a gate-source voltage ($V_{GS}$) along a horizontal or x-axis. Moreover, FIG. 4 utilizes a time period of less than 300 μs and a drain-source voltage ($V_{DS}$) equal to 20 V. Moreover, FIG. 4 illustrates a line denoting a temperature in degrees Celsius for each of the eight curves.

The method and system of the disclosure may operate such that during the turn-on of the device, as the gate voltage begins to rise, the device may start conducting significant current. The method and system of the disclosure may then sweep the gate voltage over a very short time while the device starts to conduct current. In one aspect, the sweeping or varying of a gate voltage may be in a range of 1 V to 20V, 1 V to 2V, 2V to 3V, 3V to 4V, 4V to 5V, 5V to 6V, 6V to 7V, 7V to 8V, 8V to 9V, 9V to 10V, 10V to 12V, 12V to 14 V, 14 V to 16 V, 16 V to 18 V, or 18 V to 20 V. In one aspect, the short time period may be a time that is sufficient enough to balance a settling time for a measurement and limit self-heating. For example, the short time period may be 10 μs to 500 μs, 10 μs to 50 μs, 50 μs to 100 μs, 100 μs to 200 μs, 200 μs to 300 μs, 300 μs to 400 μs, or 400 μs to 500 μs. The method and system of the disclosure may operate to implement a process to measure a behavior of a device that is very close to a behavior measured by a curve tracer with a transfer curve test. In this regard, a datasheet example of transfer curves is shown in FIG. 4 as generated by the method and system of the disclosure.

Figure 5:
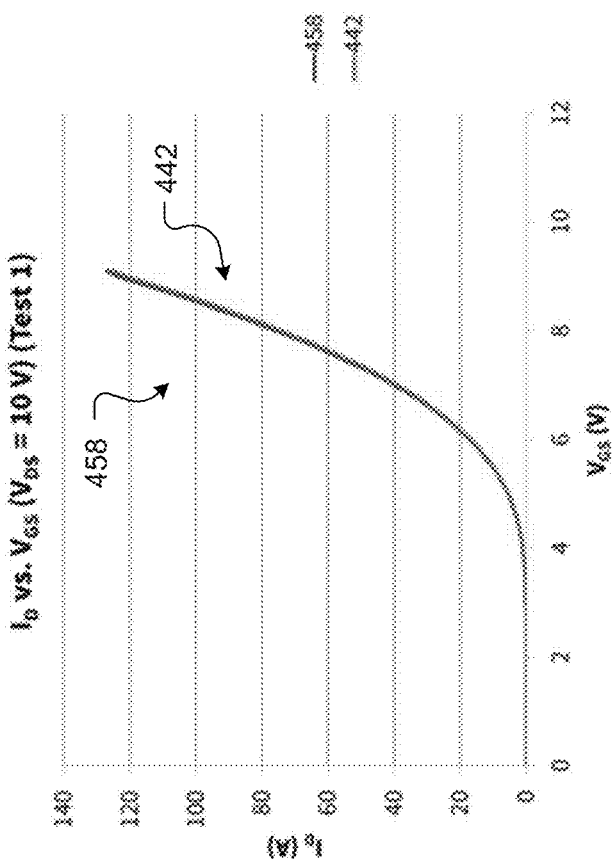
FIG. 5 illustrates graphs of a transient response and a transfer curve for matched devices.
Figure 5:
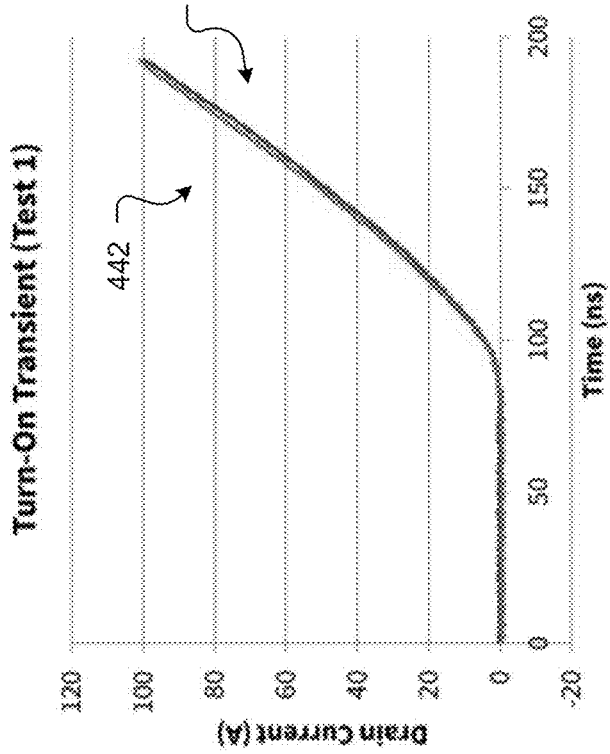

FIG. 5 illustrates graphs of a transient response and a transfer curve for matched devices.

In particular, FIG. 5 illustrates the time-domain transient response of two turn-on drain current waveforms of two closely-matched MOSFETs (device 458 and device 442) with the vertical axis or y-axis illustrating drain current in amps (A) and the horizontal axis or x-axis illustrating time in nanoseconds (ns); and FIG. 5 illustrates an associated transfer curve of the same two closely-matched MOSFETs (device 458 and device 442) with the vertical axis or y-axis illustrating drain current in amps ($I_D$) and the horizontal axis or x-axis illustrating the gate-source voltage ($V_{GS}$) in volts (V).

In this regard, the method and system of the disclosure utilizes dynamic characterization data and post processing of time domain waveforms of the gate-source voltage ($V_{GS}$) and the drain-source current ($I_{DS}$). The method and system of the disclosure may thereafter generate and obtain a plot of gate-source voltage ($V_{GS}$) vs. drain-source current ($I_{DS}$) as illustrated in FIG. 5.

Next, the method and system of the disclosure may compare the time-domain-generated gate-source voltage ($V_{GS}$) vs. drain-source current ($I_{DS}$) plot to determine the curve tracer's transfer curve. In this regard the method and system of the disclosure may generate the curve tracer's transfer curve, which provides a clearly strong behavioral correlation. In this regard, FIG. 5 illustrates the transfer curve of two closely-matched MOSFETs, and the time-domain transient response of the two turn-on drain current waveforms.

Figure 6:
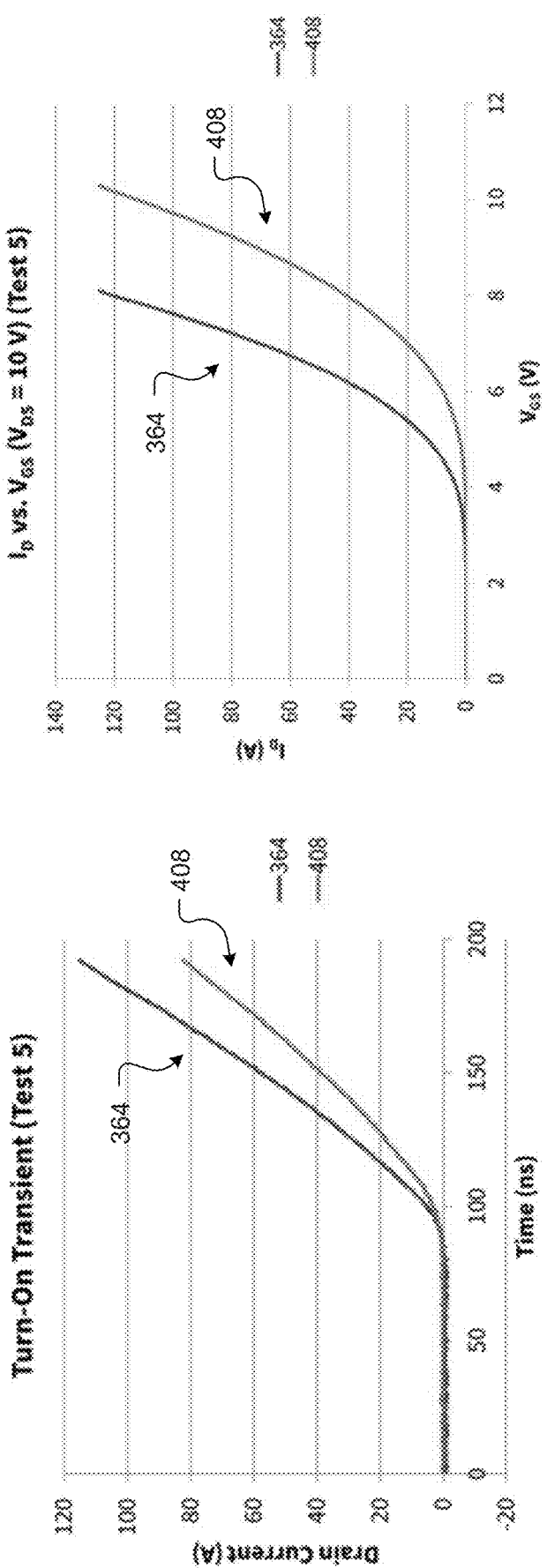
FIG. 6 illustrates graphs of a transient response and a transfer curve for mismatched devices.

FIG. 6 illustrates graphs of a transient response and a transfer curve for mismatched devices.

In particular, FIG. 6 illustrates the time-domain transient response of two turn-on drain current waveforms of two poorly-matched MOSFETs (device 364 and device 408) with the vertical axis or y-axis illustrating drain current in amps (A) and the horizontal axis or x-axis illustrating time in nanoseconds (ns); and FIG. 6 illustrates an associated transfer curve of the same two poorly-matched MOSFETs (device 364 and device 408) with the vertical axis or y-axis illustrating drain current in amps ($I_D$) and the horizontal axis or x-axis illustrating the gate-source voltage ($V_{GS}$) in volts (V).

In this regard, FIG. 6 illustrates that the MOSFETs (device 364 and device 408) are poorly-matched, and the resulting turn-on transient waveforms also deviate greatly. Therefore, the relationship between transfer curves gathered on a curve tracer may provide a strong correlation to the transient behavior of the MOSFETs when operated in parallel.

FIG. 7 illustrates a Table 1 presenting data on threshold voltage and on-resistance of eight random power modules.

In this regard, to support and validate the method and system of the disclosure, fully assembled power modules (product number CAB450M12XM3 available from Wolfspeed, Durham, N.C., USA) were utilized to simplify the current measurement process as opposed to measuring current through bare die. The eight modules were selected at random. The threshold voltage ($V_{TH}$) and on-resistance ($R_{DS-On}$) values of the eight modules are shown in of FIG. 7.

Figure 8:
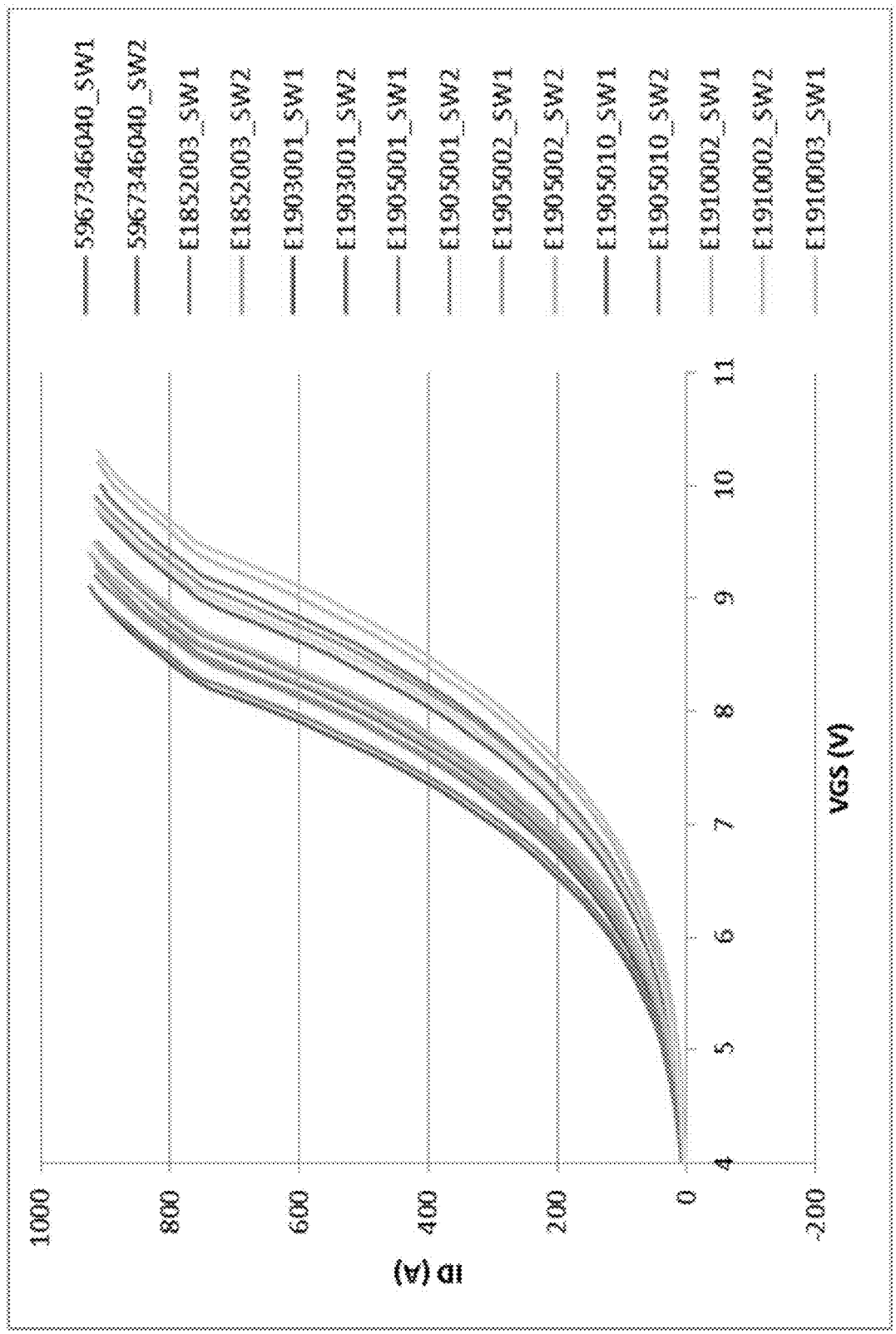
FIG. 8 illustrates transfer curves for the eight randomly selected power modules of FIG. 7.

FIG. 8 illustrates transfer curves for the eight randomly selected power modules of FIG. 7.

In particular, FIG. 8 illustrates the time-domain-generated gate-source voltage ($V_{GS}$) vs. drain current ($I_D$) plot of the eight randomly selected power modules utilizing the method and system of the disclosure. In particular, the vertical axis or y-axis illustrating drain current in amps ($I_D$) and the horizontal axis or x-axis illustrating the gate-source voltage ($V_{GS}$) in volts (V) for the eight randomly selected power modules.

Figure 9:
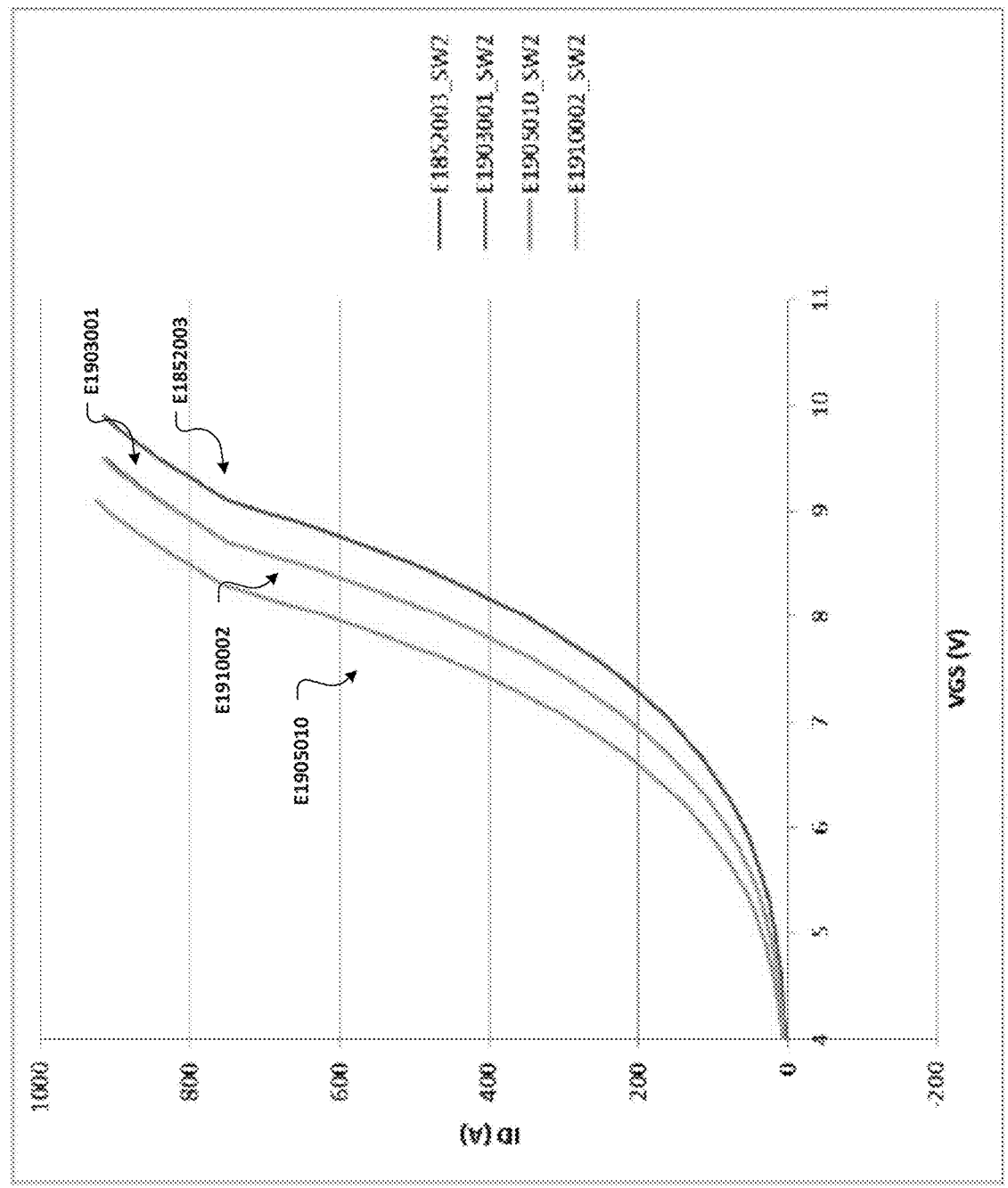
FIG. 9 illustrates low-side transfer curves for four down selected power modules of FIG. 7 and FIG. 8.

FIG. 9 illustrates low-side transfer curves for four down selected power modules of FIG. 8.

In this regard, four power modules of the eight randomly selected power modules were down-selected. In particular, two modules with matched transfer curves (power module E1903001 and power module E1910002); one module with high gain (power module E1905010); and one module with low gain (power module E1910002). These characteristics are evident by the low-side (SW2) transfer curves of the down-selected modules shown in FIG. 9.

As shown in FIG. 9, the transfer curves of power module E1903001 and power module E1910002 are nearly matched. As further shown in FIG. 9, the transfer curve of power module E1905010 has higher gain and the transfer curve of power module E1852003 has lower gain. Note, all modules down-selected have very similar threshold voltage ($V_{TH}$) ($\Delta V_{TH}$=162 mV) as illustrated in Table 1 of FIG. 7.

Figure 10:
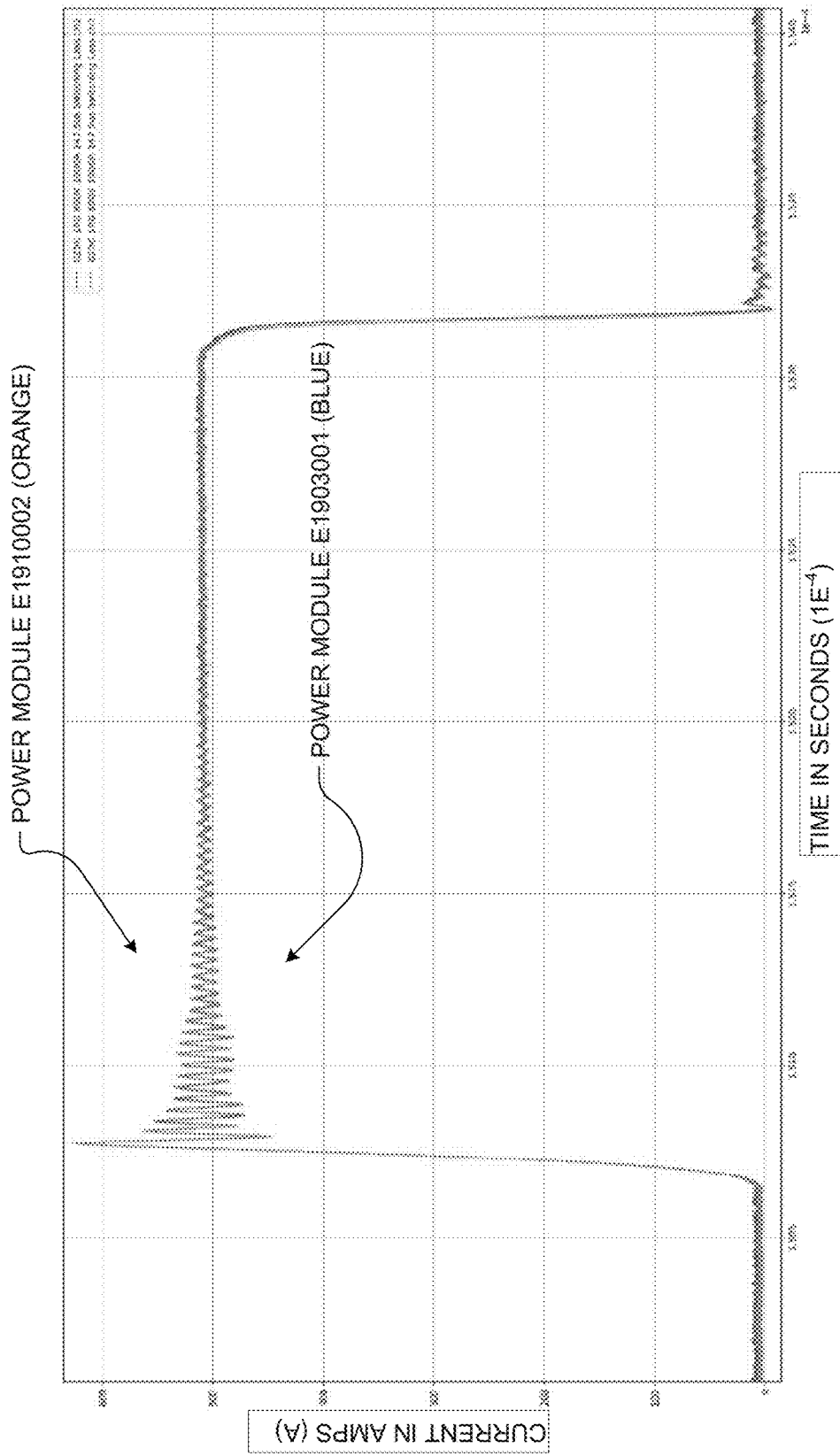
FIG. 10 illustrates turn-on and turn-off current sharing of two particular power modules of FIG. 7 and FIG. 8.

FIG. 10 illustrates turn-on and turn-off current sharing of two particular power modules of FIG. 7 and FIG. 8.

In particular, FIG. 10 illustrates Turn-on and turn-off current sharing of the power module E1903001 (blue) and the power module E1910002 (orange). In particular, the vertical axis or y-axis illustrating current in amps (A) and the horizontal axis or x-axis presenting time in seconds ($1e^{-4}$).

In particular, clamped inductive load (CIL) testing was conducted for the matched case and a drain current for the power module E1903001 and the power module E191002 are shown in FIG. 10 (test condition 1).

Figure 11:
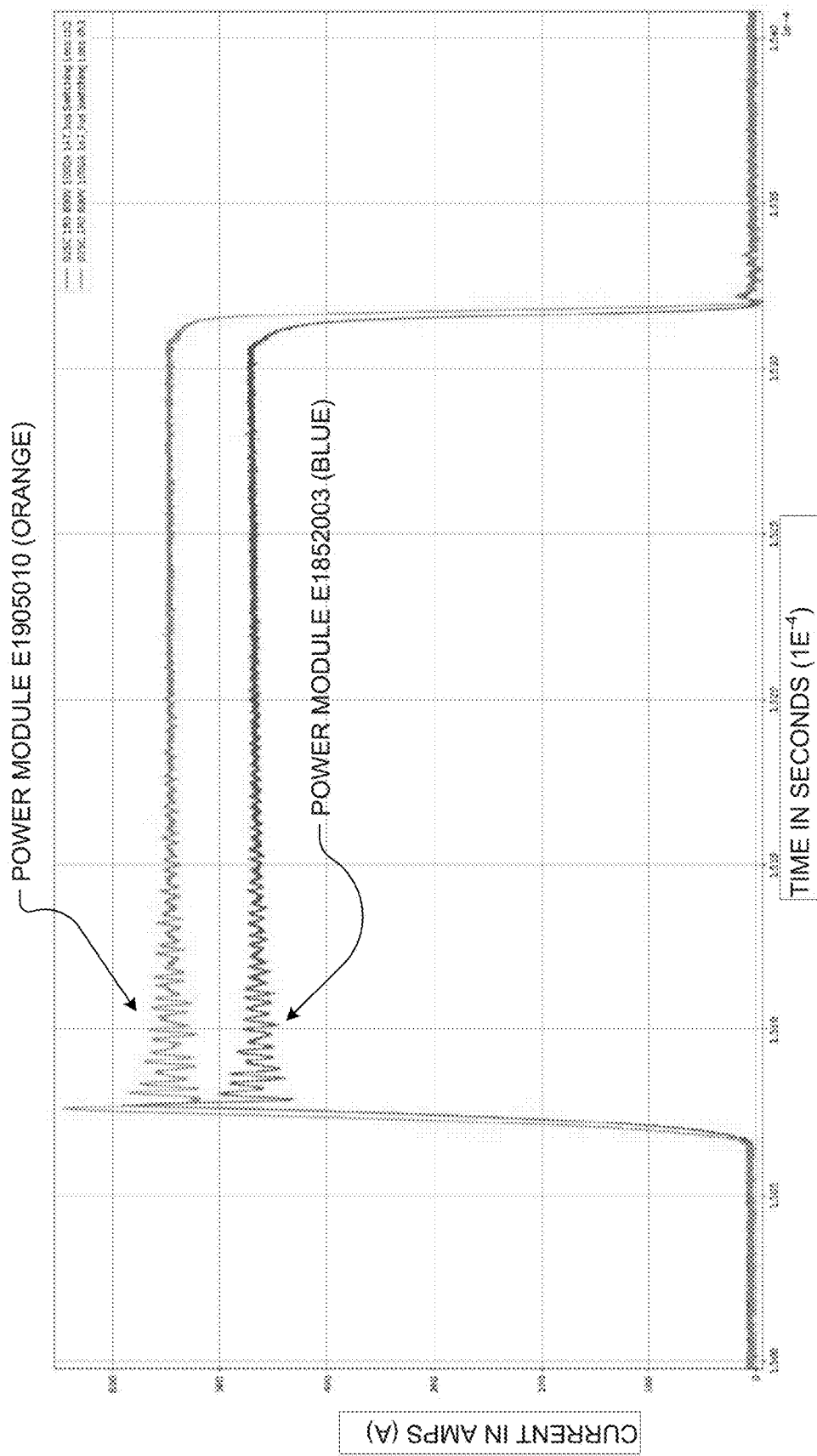
FIG. 11 illustrates turn-on and turn-off current sharing of another two particular power modules of FIG. 7 and FIG. 8.

FIG. 11 illustrates turn-on and turn-off current sharing of another two particular power modules of FIG. 7 and FIG. 8.

In particular, FIG. 11 illustrates turn-on and turn-off current sharing of the power module E1852003 (blue) and the power module E1905010 (orange). In particular, the vertical axis or y-axis illustrating current in amps (A) and the horizontal axis or x-axis presenting time in seconds ($1e^{-4}$).

In particular, this worst-case sharing was tested by switching devices of the power module E1852003 and the power module E1905010 in parallel with dynamic results shown in FIG. 11 (test condition 2). In particular, the vertical axis or y-axis illustrating current in amps (A) and the horizontal axis or x-axis presenting time in seconds ($1e^{-4}$).

Figure 12:
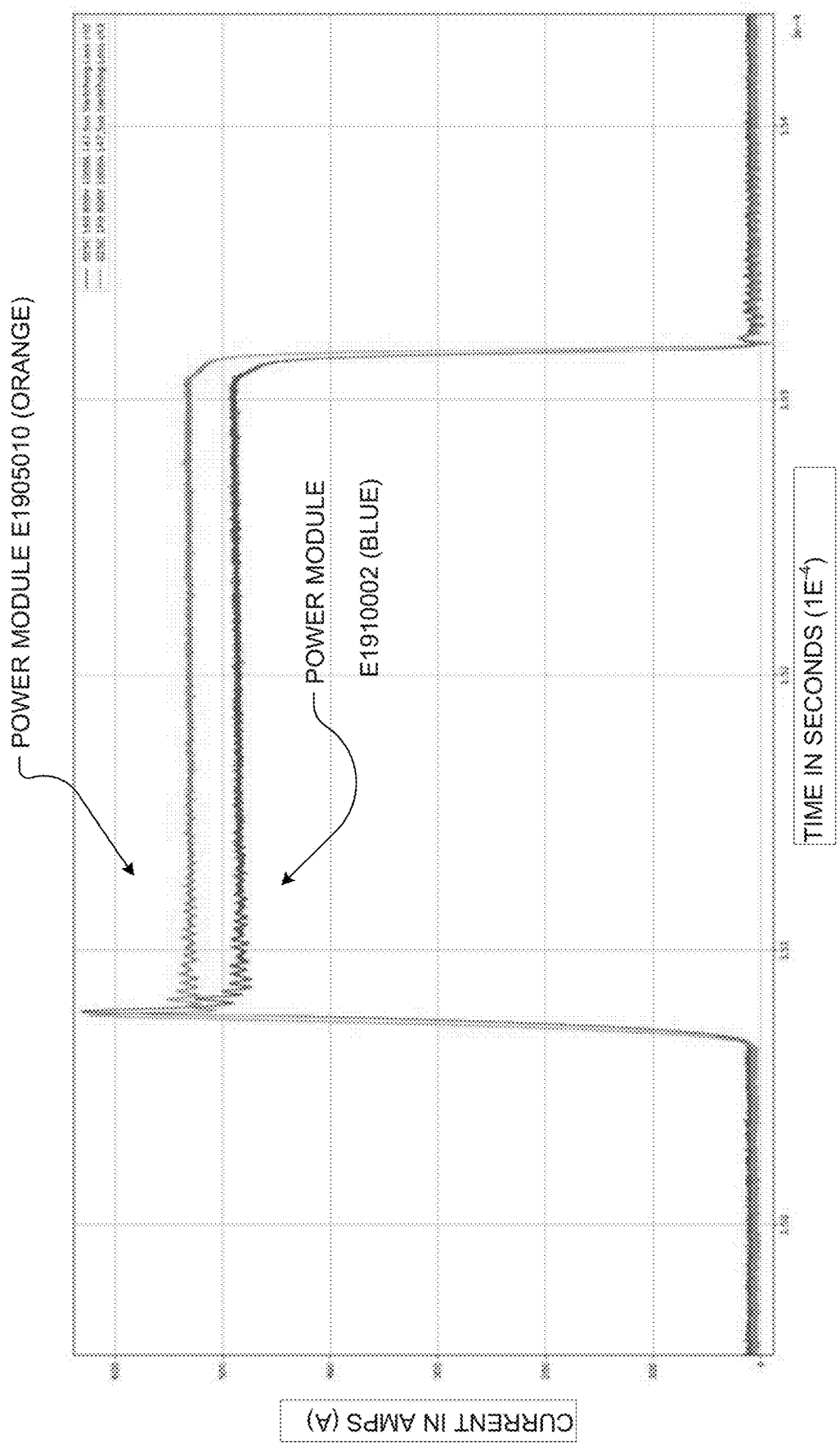
FIG. 12 illustrates turn-on and turn-off current sharing of another two particular power modules of FIG. 7 and FIG. 8.

FIG. 12 illustrates turn-on and turn-off current sharing of another two particular power modules.

In particular, FIG. 12 illustrates turn-on and turn-off current sharing of the power module E1910002 (blue) and the power module E1905010 (orange). In particular, the vertical axis or y-axis illustrating current in amps (A) and the horizontal axis or x-axis presenting time in seconds ($1e^{-4}$).

To validate that the transfer curve is the key matching parameter as opposed to the threshold voltage, the power module E1910002 and the E1905010 are paralleled in FIG. 12 (test condition 3). In particular, the vertical axis or y-axis illustrating current in amps (A) and the horizontal axis or x-axis presenting time in seconds ($1e^{-4}$).

In this regard, the devices implemented as part of FIG. 12 still show dynamic mismatch even with a difference in threshold voltage of only 4.62 mV (as shown in Table 1 of FIG. 7), an impractically small bin. This illustrates that binning by threshold voltage ($V_{TH}$) alone does not provide insight to equal current sharing.

FIG. 13 illustrates a Table 2 listing a summary of losses for each test condition.

More specifically, Table 2 illustrates in a first column the test conditions as described above (test condition 1, test condition 2, and test condition 3); Table 2 illustrates in a second column a percentage that is a ratio of a difference in turnoff loss ($\Delta$Eoff) to a turnoff loss (Eoff); Table 2 illustrates in a third column a percentage that is a ratio of a difference in turnon loss ($\Delta$Eon) to a turnon loss (Eon); Table 2 illustrates in a fourth column a difference in conduction loss watts (W); and Table 2 illustrates in a fifth column a percentage that is a ratio of a difference in conduction loss in watts (W) to a conduction loss in watts (W). In this regard, Table 2 illustrates that test condition 1 provides the most favorable values of losses consistent with FIG. 9 and FIG. 10.

In this regard, FIG. 11 and FIG. 12 illustrate that the transfer curve predicts the sharing behavior of the devices. For example, power module E1905010 is shown to have the highest gain on the transfer curve; likewise, in dynamic testing, this device is the first to turn on and conducts the highest current. The dynamic losses and static losses (calculated based on on-resistance ($R_{DS-on}$) during the on interval) for the three test cases are summarized in Table 2 of FIG. 3.

Figure 14:
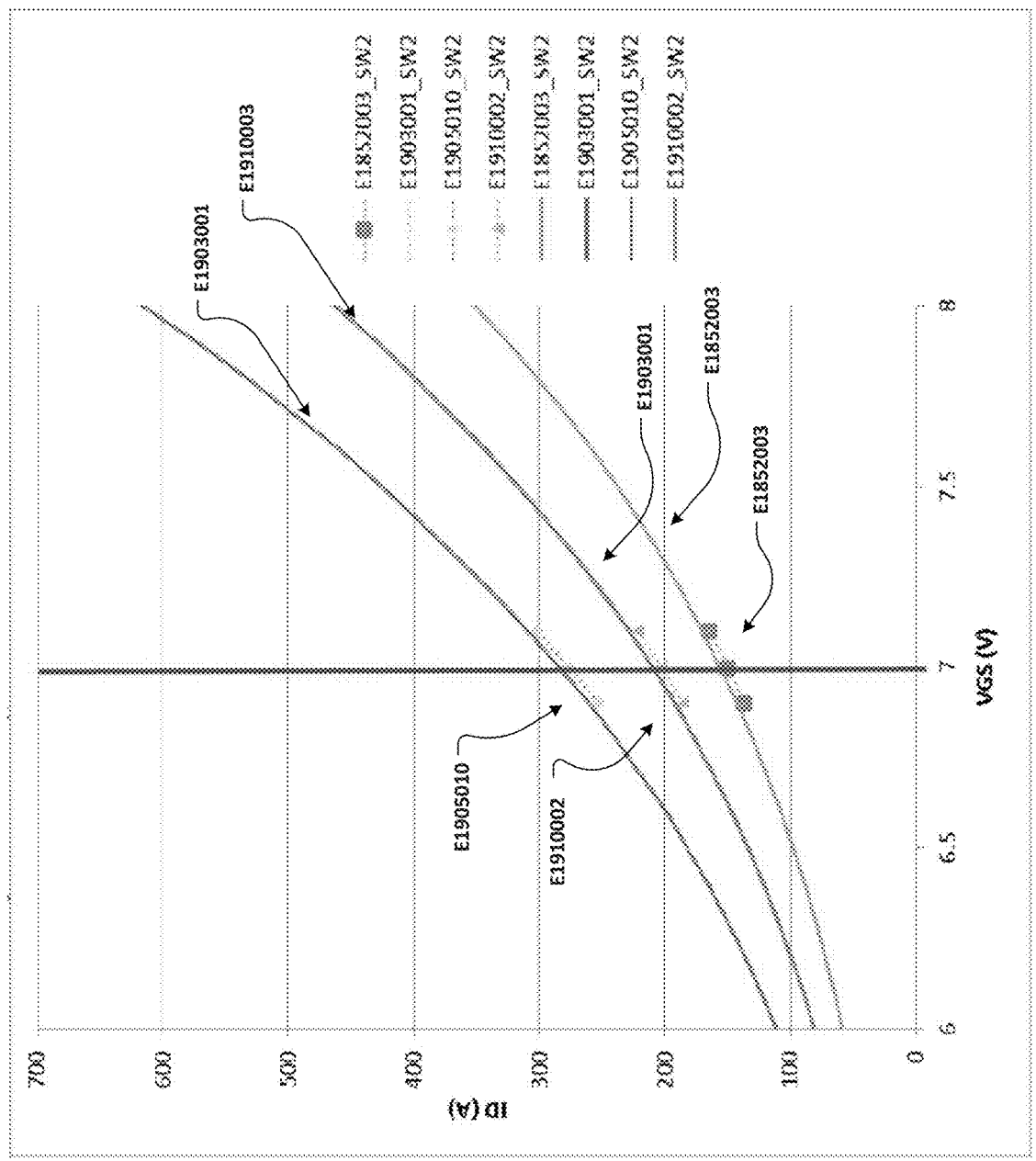
FIG. 14 illustrates a full transfer curve plotted against a reduced point curve.

FIG. 14 illustrates a full transfer curve plotted against a reduced point curve.

In particular, the vertical axis or y-axis illustrating drain current ($I_D$) in amps (A) and the horizontal axis or x-axis illustrating the gate-source voltage ($V_{GS}$) in volts (V) for the eight randomly selected power modules.

FIG. 15 illustrates a Table 3 listing drain current at a particular gate-source voltage ($V_{GS}$) for devices down-selected for testing.

In particular, FIG. 15 illustrates Table 3 listing Drain Current in amps (A) when the gate-source voltage ($V_{GS}$)=7 V for devices that were down-selected for testing as described herein.

In this regard, the power modules may be characterized at a gate-source voltage ($V_{GS}$)=7 V. However, as disclosed herein, other voltages are contemplated as well. The curve tracer may be programmed to take a limited number of total data points to ensure stability of the results. In one aspect, the limited number of total data points may be 2-20, 2-4, 4-6, 6-8, 8-10, 10-12, 12-14, 14-16, 16-18, or 18-20. It is shown that two tests return slightly different results in FIG. 14, but the behavior is still the same. The values at $V_{GS}$=7 V are tabulated in Table 3 of FIG. 15 and can be directly used for matching as described herein.

In one aspect, utilizing the method and system of the disclosure, a limited number of operating points on the transfer curve may be selected. Thereafter, the limited number of values may be utilized for binning and/or matching. More specifically, a limited number of operating points on the transfer curve may be selected representing currents for each device may be selected.

The limited number of operating points on the transfer curve representing currents may be utilized or binning and or matching devices. More specifically, devices exhibiting operating points on the transfer curve representing currents that are within a predetermined range may be selected as binning and or matching devices.

In one aspect, utilizing the method and system of the disclosure, a single operating point on the transfer curve may be selected. Thereafter, the single value can be utilized for binning and or matching. More specifically, a single operating point on the transfer curve may be selected representing current for each device may be selected. The single operating point on the transfer curve representing current may be utilized or binning and or matching devices. More specifically, devices exhibiting an operating point on the transfer curve representing a current that are within a predetermined range may be selected as binning and or matching devices.

The predetermined range may be 0 amps to 40 amps, 0 amps to 10 amps, 0 amps to 20 amps, 0 amps to 30 amps, or 0 amps to 40 amps. The predetermined range may be 0% to 20% of the current, 0% to 5% of the current, 0% to 10% of the current, 0% to 15% of the current, or 0% to 20% of the current.

Additionally, the predetermined range or width of the bin may be determined on several criteria such as die distribution, volume of product, and the like such that the binning ensures generally consistent dynamic losses and static losses.

The disclosed method and system may be utilized for any type of semiconductor device, transistor, power device, and/or power module. In this regard, the transistor types may include but are not limited to a MEtal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), and the like. The term power device may refer to various forms of transistors and diodes designed for high voltages and currents. The transistors may be controllable switches allowing for unidirectional or bidirectional current flow (depending on device type) while the diodes may allow for current flow in one direction and may not controllable. The power module may implement a plurality of power devices that range in structure and purpose.

The disclosed method and system may be utilized for a power module that may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies. The power devices may include Wide Band Gap (WBG) semiconductors, including Gallium Nitride (GaN), Silicon Carbide (SiC), and the like, and offer numerous advantages over conventional Silicon (Si) as a material for the power devices. Nevertheless, various aspects of the disclosure may utilize Si type power devices and achieve a number of the benefits described herein.

In one aspect, the disclosed method and system may be utilized for configuration of a power module such that the power module may evenly distribute current between large arrays of paralleled devices. The disclosed method and system may be utilized for configuration of a power module such that the power module may achieve significant improvements to the internal module performance. The disclosed method and system may be utilized for configuration of a power module to allow for full utilization of the capabilities of advanced power semiconductors, providing significant improvements to power density, switching, efficiency, and the like.

In one aspect, the disclosed method and system may be utilized for configuration of a plurality power modules such that the plurality power modules may evenly distribute current between large arrays of paralleled devices. The disclosed method and system may be utilized for configuration of a plurality power modules such that the plurality power modules may achieve significant improvements to the internal module performance. The disclosed method and system may be utilized for configuration of a plurality power modules to allow for full utilization of the capabilities of advanced power semiconductors, providing significant improvements to power density, switching, efficiency, and the like.

Figure 16B:
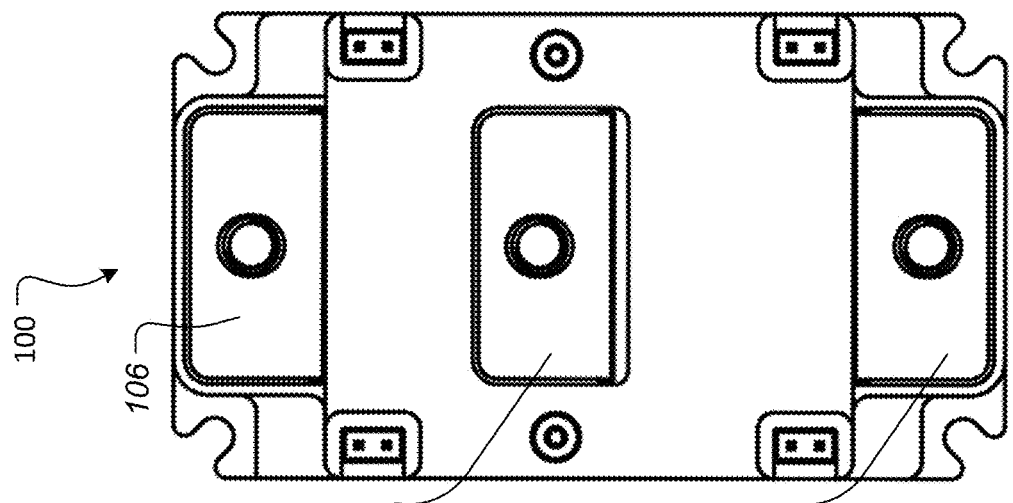
FIG. 16B illustrates a top schematic view of a power module according constructed to an aspect of the disclosure.
Figure 16A:
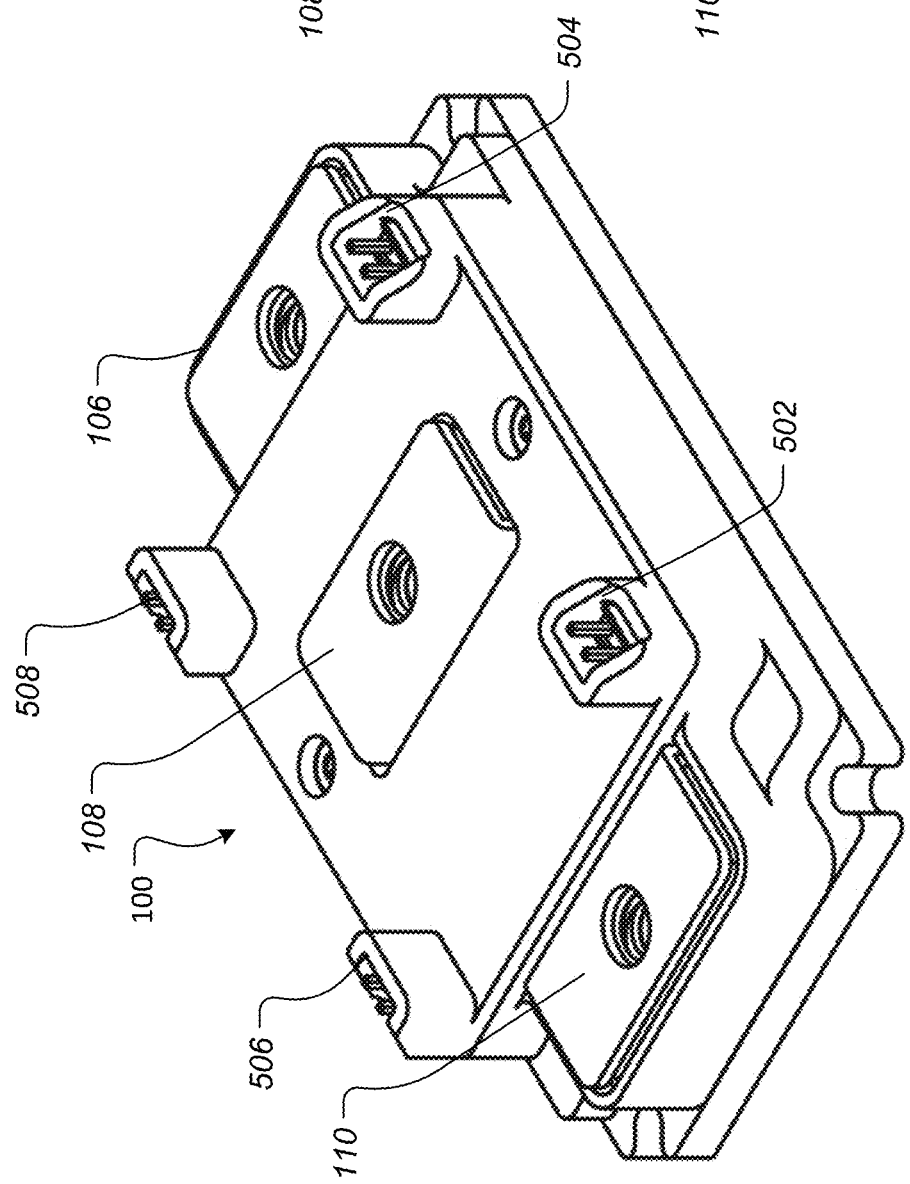
FIG. 16A illustrates a perspective schematic view of a power module constructed according to an aspect of the disclosure.
Figure 17:
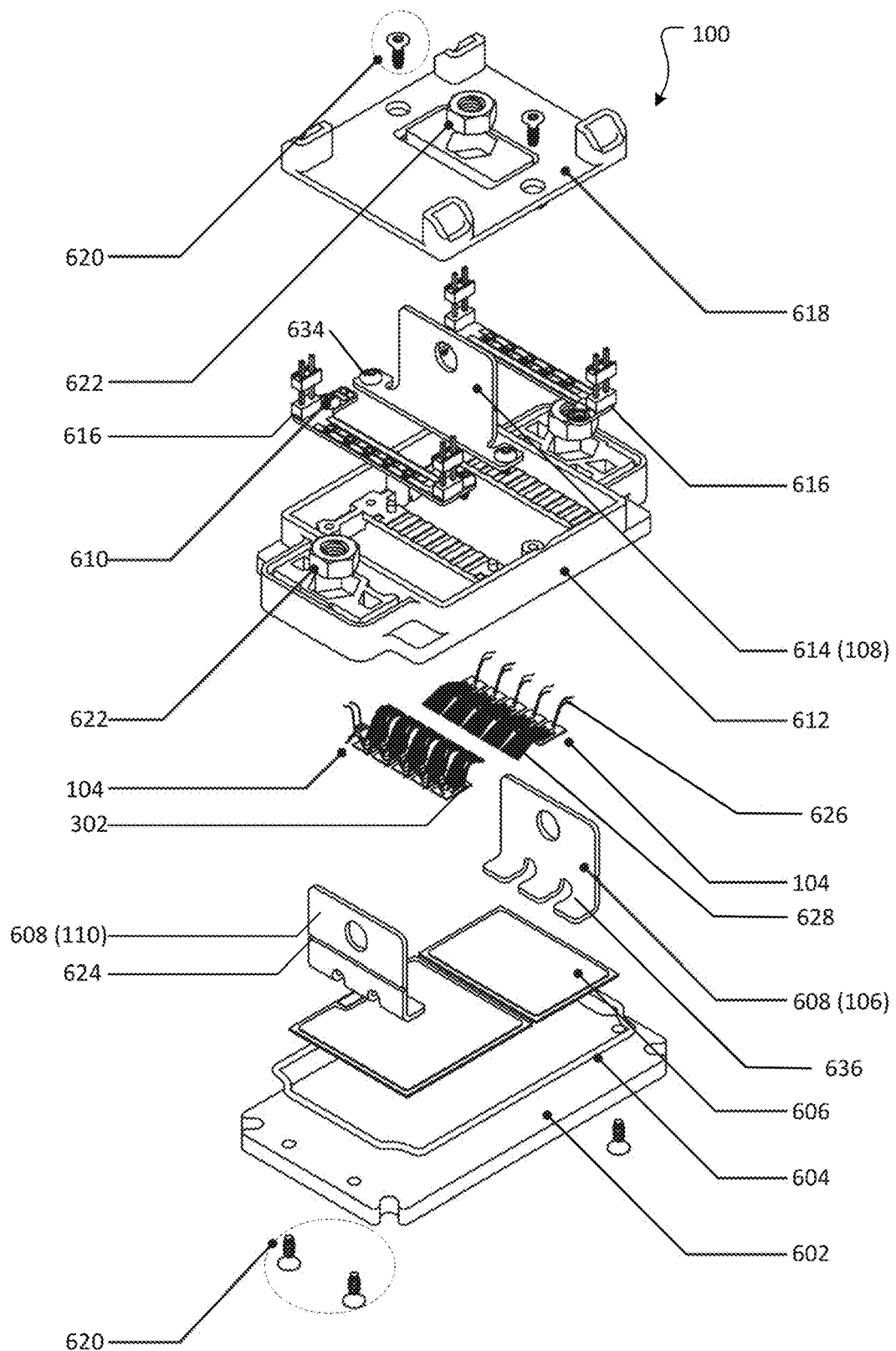
FIG. 17 illustrates an exploded view of a power module according to aspects of the disclosure.
Figure 18:
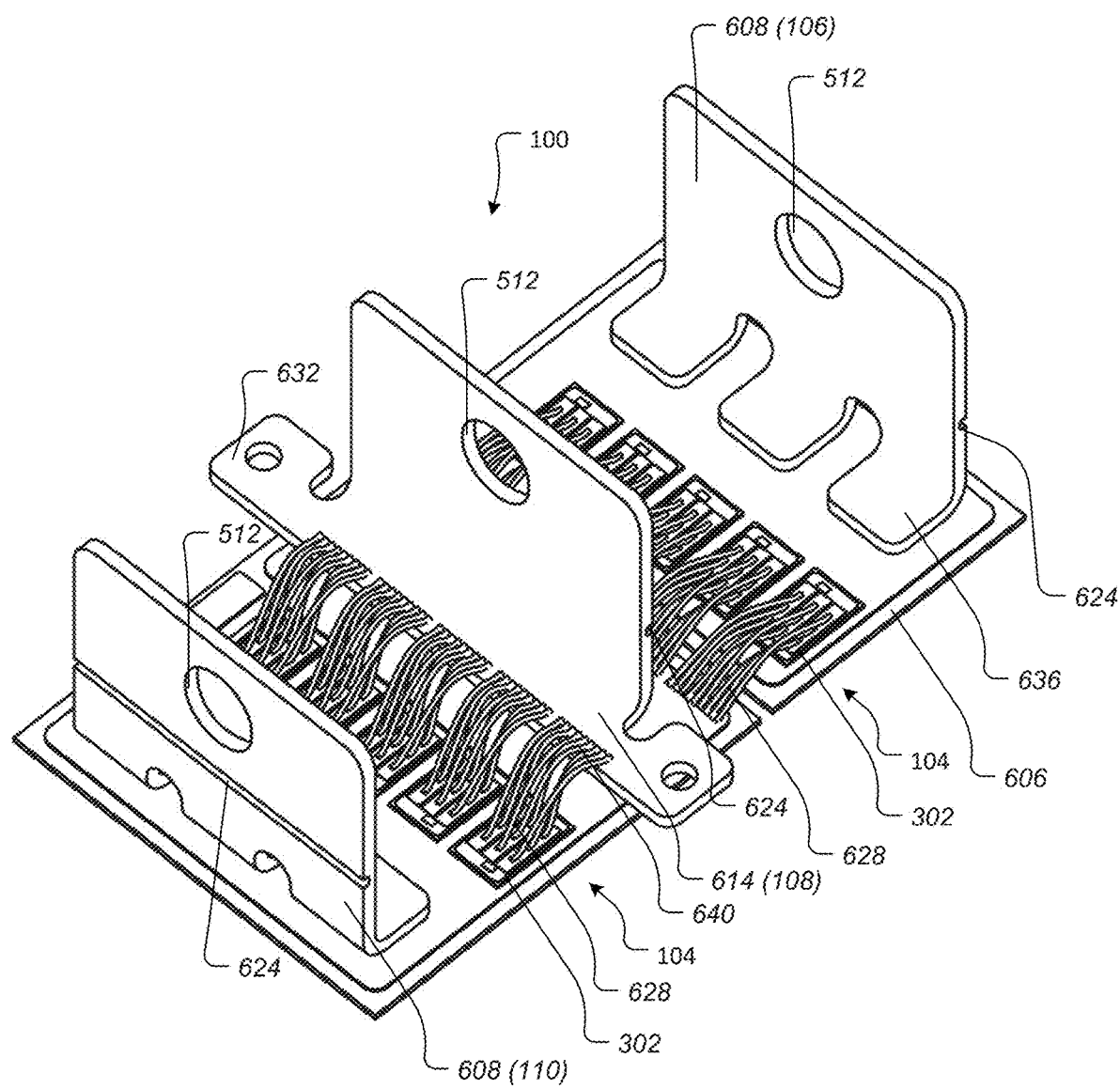
FIG. 18 illustrates a partial view of the power module of FIG. 17.

FIG. 16A illustrates a perspective schematic view of a power module constructed according to an aspect of the disclosure; FIG. 16B illustrates a top schematic view of a power module constructed according to an aspect of the disclosure; FIG. 17 illustrates an exploded view of the power module according to aspects of the disclosure; and FIG. 18 illustrates a partial view of the power module of FIG. 17.

As will be appreciated by those skilled in the art, power modules are known in various forms. Power modules provide a physical containment for power components, usually power semiconductor devices. These power semiconductors are typically soldered or sintered on a power electronic substrate. The power module typically carries the power semiconductors, provides electrical and thermal contact, and includes electrical insulation.

In particular, a half-bridge configuration of the power module 100 is illustrated in FIG. 16A and FIG. 16B; and FIG. 17 illustrates a number of elements in a power module 100. The power module 100 may include one or more switch positions 104. The one or more switch positions 104 may include power devices 302 that may include any combination of controllable switches and diodes placed in parallel to meet requirements for current, voltage, and efficiency.

In particular, the power devices 302 may be selected and implemented consistent with the disclosed method and system of the disclosure. More specifically, the power devices 302 may be subjected to the binning and/or matching process 200 as described herein.

In this regard, the binning and/or matching process 200 may be applied to each of the power devices 302 for the power module 100. Moreover, the binning and/or matching process 200 may be applied to each power module 100 utilized in a multiple power module implementation.

Accordingly, the power devices 302 implemented by the power module 100 may be configured to ensure maximum sharing of losses between the power devices 302. Moreover, the power module 100 may be selected based on binning and matching to ensure maximum sharing of losses between multiple implementations of the power module 100.

Accordingly, the power module 100 and the power devices 302 may minimize derating and/or may maximize reliability by ensuring loss may be distributed equally among parallel devices reducing a tendency for thermal mismatch, runaway, and the like. The disclosed power module 100 and the power devices 302 may be utilized to deliver customer-matched components, which can be used to realize scalable architectures operating in parallel.

More specifically, the power module 100 and the power devices 302 may ensure key loss mechanisms are more accurately matched such that each power module 100 and each of the power devices 302 may be at or near the same temperature, share losses equally, evenly distribute current, consistently perform, and/or the like.

Figure 19:
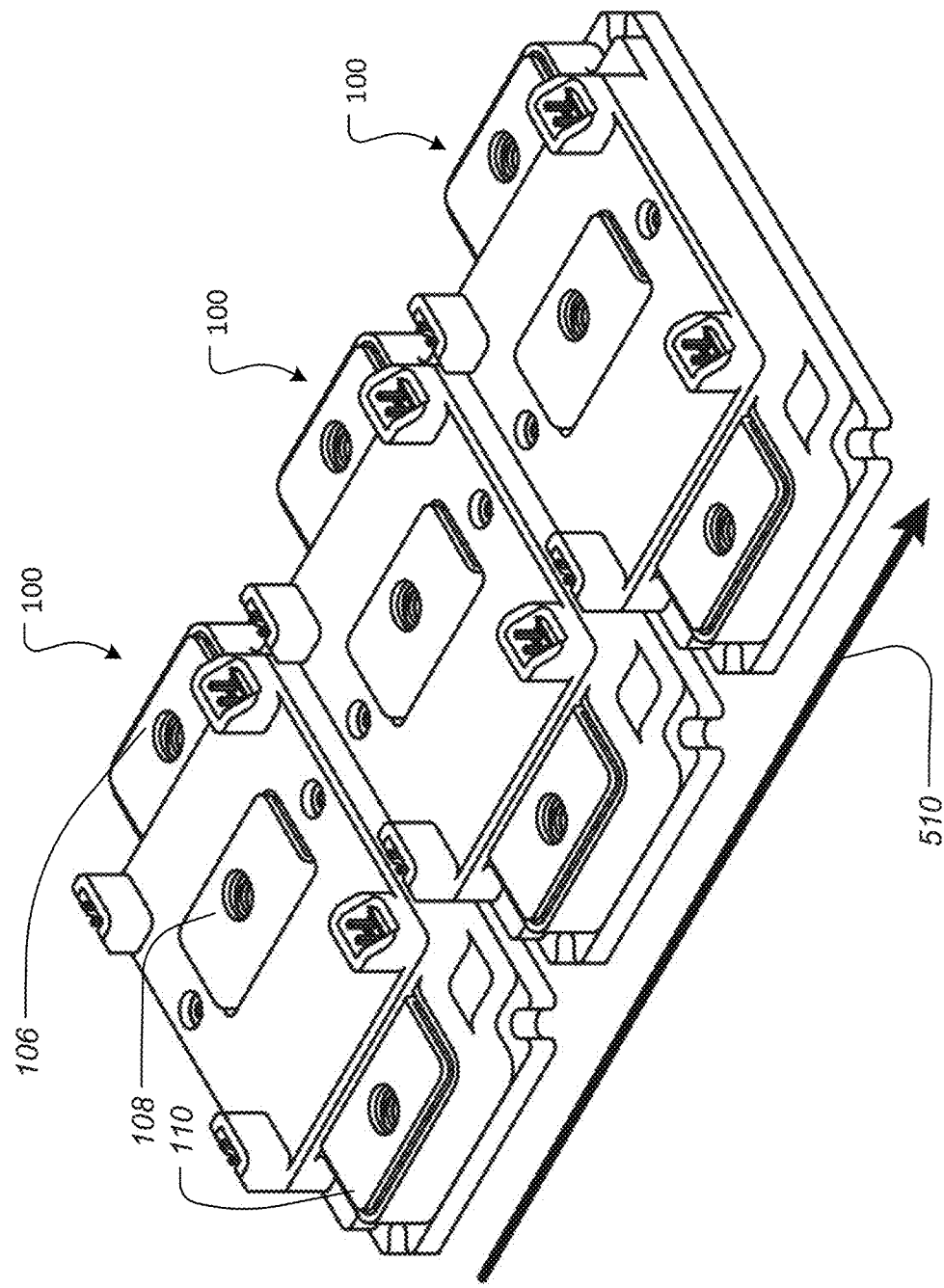
FIG. 19 illustrates a plurality of single phase modules in a paralleled configuration according to aspects of the disclosure.

FIG. 19 illustrates a plurality of single phase modules in a paralleled configuration according to aspects of the disclosure.

A single phase configuration of the power module 100 may be easily paralleled to reach higher currents. As is illustrated in FIG. 19 there are three power modules 100 illustrated, but there is no limit to how many could be configured in this manner. In this regard, arrow 510 shows that additional power modules 100 may be arranged in parallel. When paralleled, each of the corresponding terminals 106, 108, 110 may be electrically connected between each of the power modules 100.

In this regard, the binning and/or matching process 200 may be applied to each of the power devices 302 for the power module 100. Moreover, the binning and/or matching process 200 may be applied to each power module 100 utilized in the multiple power module implementation of FIG. 19.

Figure 20A:
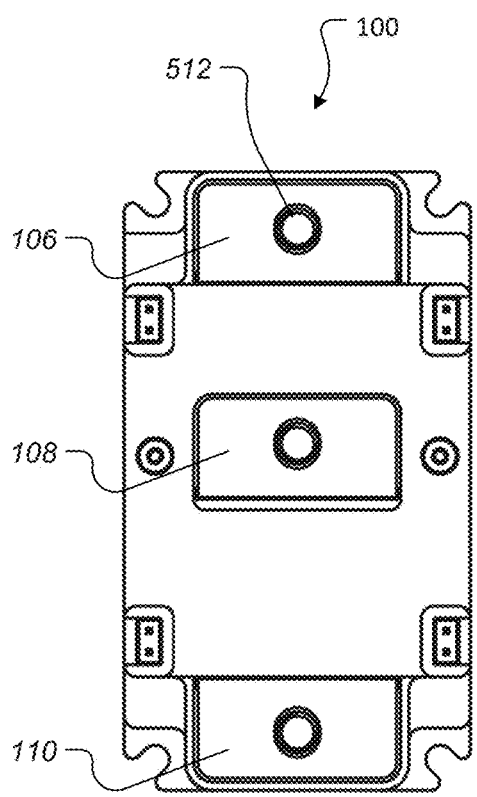
FIG. 20A illustrates a first power module configuration according to aspects of the disclosure.
Figure 20B:
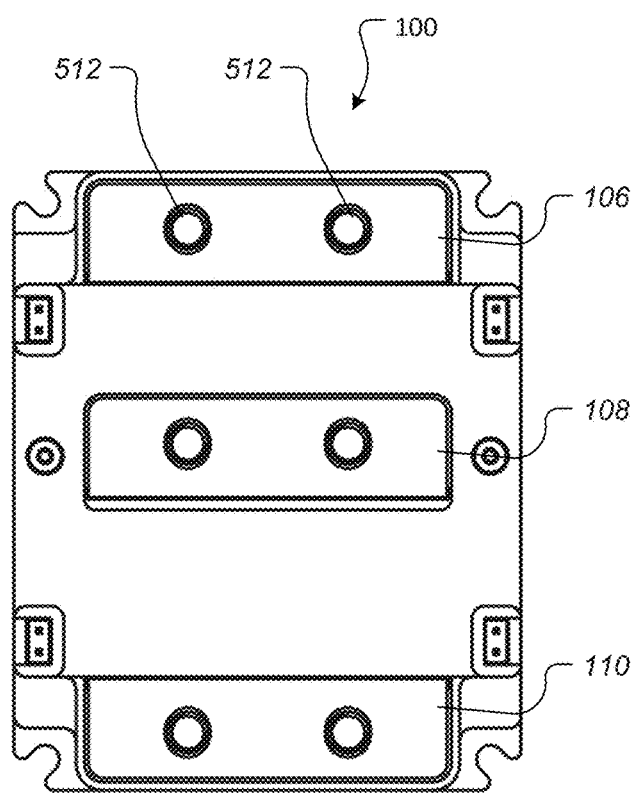
FIG. 20B illustrates a second power module configuration according to aspects of the disclosure.

FIG. 20A illustrates a first power module configuration according to aspects of the disclosure; and FIG. 20B illustrates a second power module configuration according to aspects of the disclosure. Scalability of the disclosed power modules 100 may be another defining feature. This is depicted in FIG. 20A and FIG. 20B. As shown in FIG. 20B, the power module 100 width may be extended to accommodate more paralleled devices for each switch position 104 in comparison to the power module 100 shown in FIG. 20A. Additional fastener holes 512 may be added to the power contacts of the terminals 106, 108, 110 due to the increased current of the power module 100. It is important to note that the power modules 100 may be paralleled as shown in FIG. 19 or may be scaled as shown in FIG. 20B to match most power levels without sacrificing the benefits of this disclosure including, for example, low inductance, clean switching, high power density, and the like.

In this regard, the binning and/or matching process 200 may be applied to each of the power devices 302 for the power module 100. Moreover, the binning and/or matching process 200 may be applied to each power module 100 utilized in a multiple power module implementation of FIG. 20A and FIG. 20B.

Figure 21:
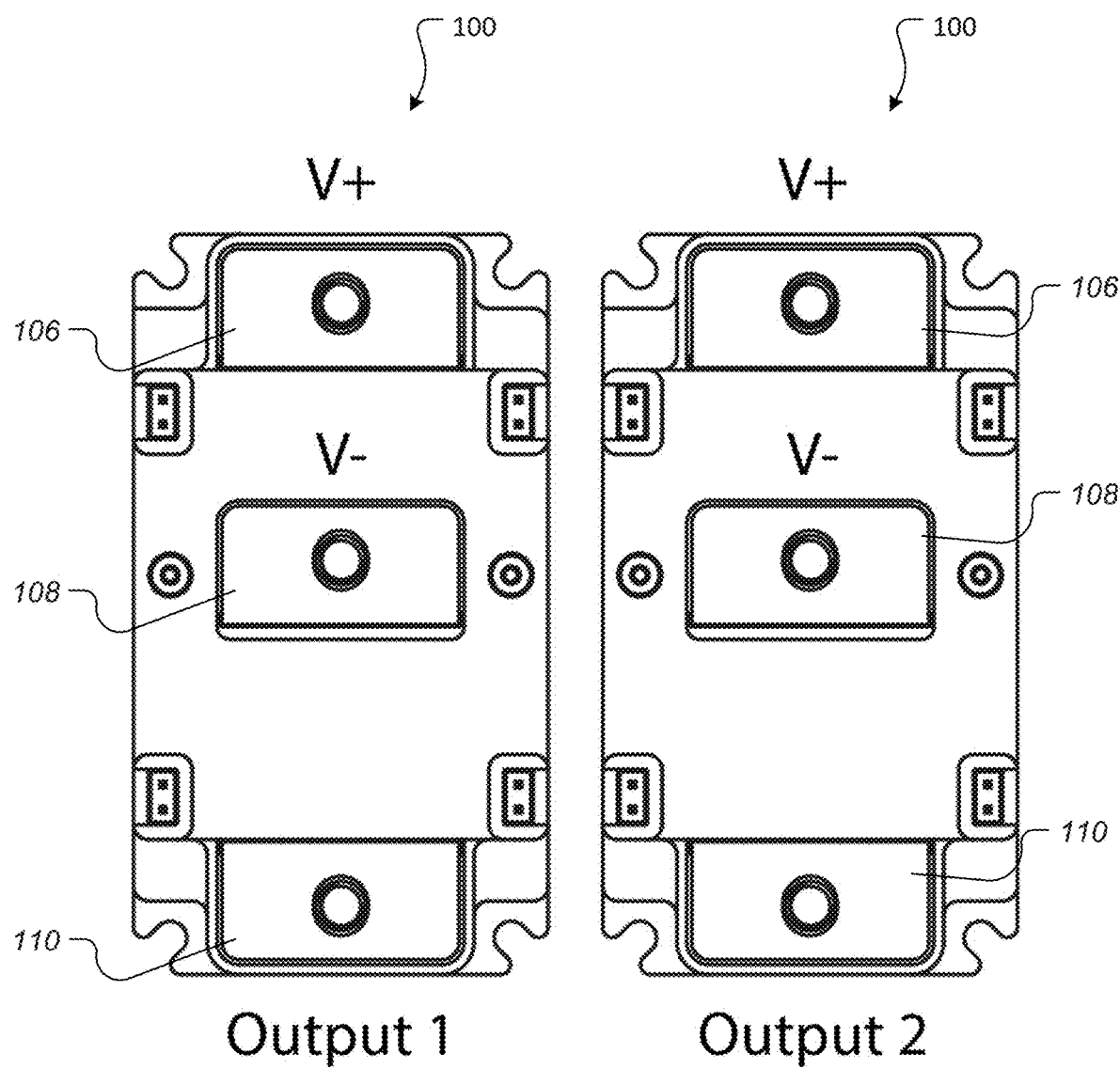
FIG. 21 illustrates a plurality of power modules in a full bridge configuration according to aspects of the disclosure.
Figure 22:
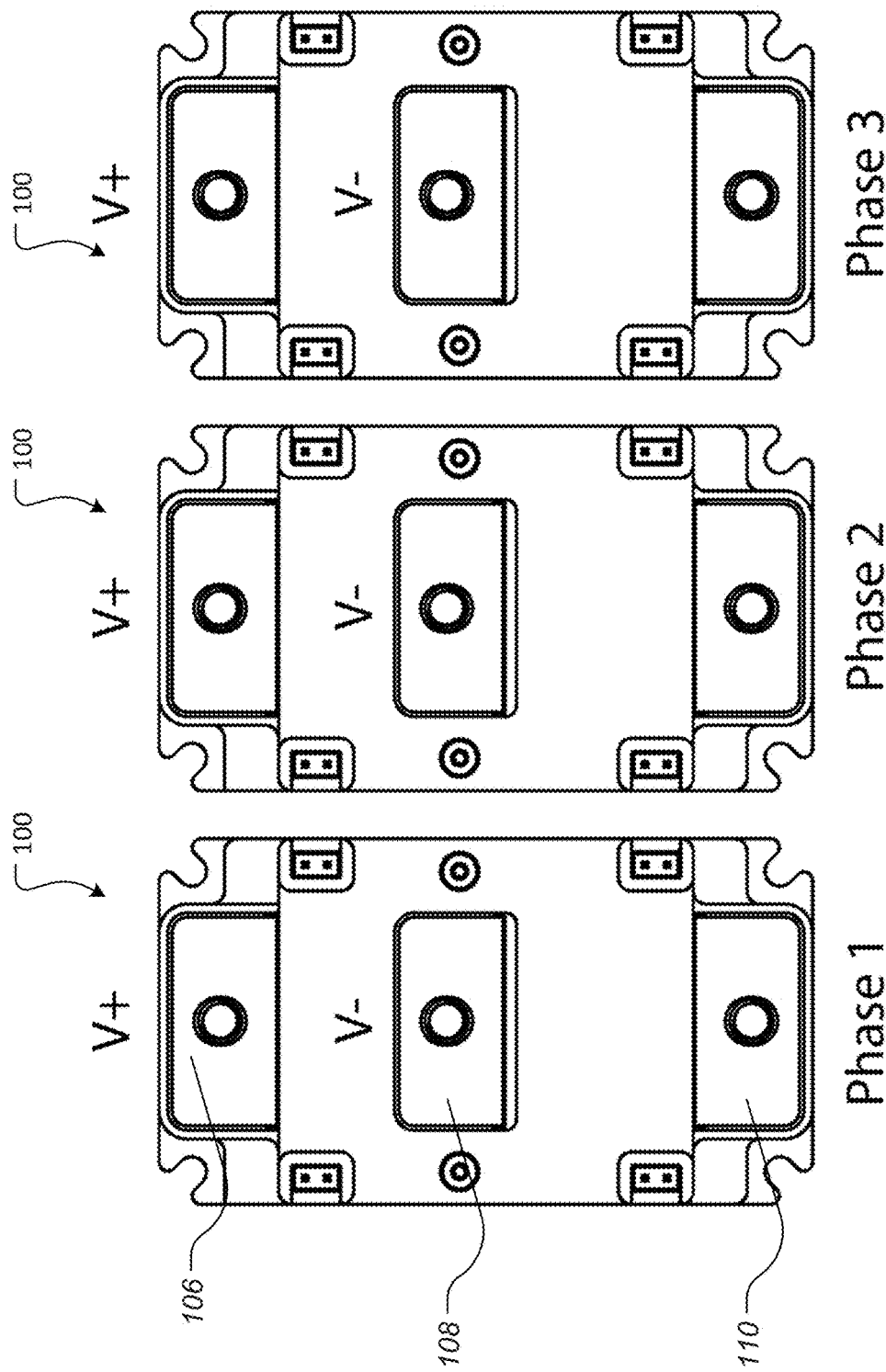
FIG. 22 illustrates a plurality of power modules in a three-phase configuration according to aspects of the disclosure.
Figure 23:
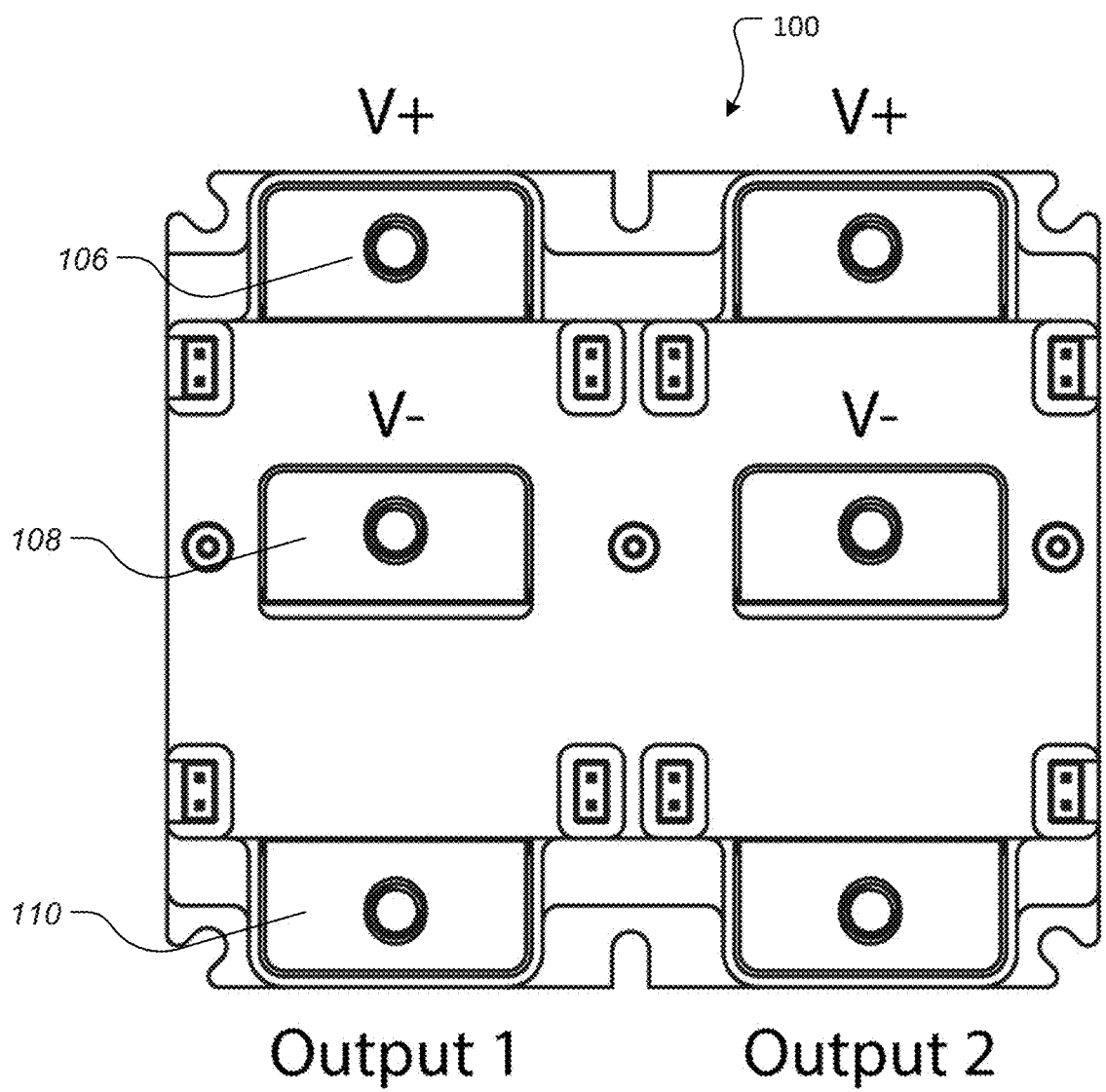
FIG. 23 illustrates a single power module having a full bridge configuration according to aspects of the disclosure.

FIG. 21 illustrates power modules in a full bridge configuration according to aspects of the disclosure; FIG. 22 illustrates a power module in a three-phase configuration according to aspects of the disclosure; and FIG. 23 illustrates a single power module having a full bridge configuration according to aspects of the disclosure. In some aspects, modularity may also be found in the formation of various electrical topologies, such as FIG. 21 for a full-bridge configuration of two power modules 100 and FIG. 22 for a three-phase configuration of three power modules 100. For these topologies, the V+ terminal 106 and V− terminal 108 may be interconnected while the phase output terminals 110 may remain separate. The configuration of FIG. 21 and FIG. 22 may also be placed in a single housing and may be configured with a shared base plate as illustrated in FIG. 23, which may increase power density with the tradeoff of higher unit complexity and cost.

In this regard, the binning and/or matching process 200 may be applied to each of the power devices 302 for the power module 100. Moreover, the binning and/or matching process 200 may be applied to each power module 100 utilized in a multiple power module implementation of FIG. 21, FIG. 22, and FIG. 23

Referring back to FIG. 17, the power devices 302 may be attached with solder, conductive epoxy, a silver sintering material, or the like. The upper pads on the power devices 302, including the gate and the source, may be wire bonded to their respective locations with power wire bonds 628. The power wire bonds 628 may include aluminum, an aluminum alloy, copper, or the like wires, which may be ultrasonically welded, or the like at both feet, forming a conductive arch between two metal pads. Signal bonds 626 may be formed in a similar manner and may be aluminum, gold, copper, or the like. In some aspects, the diameter of the wire of the power wire bonds at 626 may be smaller than the wire of the power wire bonds 628.

These elements include one or more of a base plate 602, a gasket 604, one or more power substrates 606, one or more edge power contacts 608, one or more switch positions 104, one or more temperature sensors 610, housing sidewalls 612, a center power contact 614, a signal interconnection assembly 616, a housing lid 618, fasteners 620, captive fasteners 622, and the like. In one aspect, the base plate 602 may include a metal. In one aspect, the metal may include copper. Moreover, it is contemplated that the power module 100 may include fewer or different elements than those described herein.

The power module 100 may include the base plate 602. The base plate 602 may provide structural support to the power module 100 as well as facilitating heat spreading for thermal management of the power module 100. The base plate 602 may include a base metal, such as copper, aluminum, or the like, or a metal matrix composite (MMC) which may provide coefficient of thermal expansion (CTE) matching to reduce thermally generated stress. In one aspect, the MMC material may be a composite of a high conductivity metal such as copper, aluminum, and the like, and either a low CTE metal such as molybdenum, beryllium, tungsten, and/or a nonmetal such as diamond, silicon carbide, beryllium oxide, graphite, embedded pyrolytic graphite, or the like. Depending on the material, the base plate 602 may be formed by machining, casting, stamping, or the like. The base plate 602 may have a metal plating, such as nickel, silver, gold and/or the like, to protect surfaces of the base plate 602 and improve solder-ability. In one aspect, the base plate 602 may have a flat backside. In one aspect, the base plate 602 may have a convex profile to improve planarity after reflow. In one aspect, the base plate 602 may have pin fins for direct cooling.

The power module 100 may include the gasket 604. The gasket 604 may improve an encapsulation process by providing a liquid tight seal. In this regard, the power module 100 may include dielectric encapsulation within. The gasket 604 may be injection molded, dispensed, or the like, and may be applied in a groove in the housing sidewalls 612 and compressed between the housing sidewalls 612 and the base plate 602.

The power module 100 may include one or more power substrates 606. The one or more power substrates 606 may provide electrical interconnection, voltage isolation, heat transfer, and the like for the power devices 302. The one or more power substrates 606 may be constructed as a direct bond copper (DBC), an active metal braze (AMB), an insulated metal substrate (IMS), or the like. In the case of the IMS structure, the one or more power substrates 606 and the base plate 602 may be integrated as the same element. In some aspects, the one or more power substrates 606 may be attached to the base plate 602 with solder, thermally conductive epoxy, silver sintering or the like. In one aspect there may be two of the power substrates 606, one for each switch position 104.

The power module 100 may include one or more edge power contacts 608. A surface of one of the one or more edge power contacts 608 may form the V+ terminal or first terminal 106. A surface of one of the one or more edge power contacts 608 may form the phase terminal or third terminal 110. The one or more edge power contacts 608 may create a high current path between an external system and the one or more power substrates 606. The one or more edge power contacts 608 may be fabricated from sheet metal through an etching process, a stamping operation, or the like. The one or more edge power contacts 608 may have a partial thickness bend assist line 624 to facilitate bending of the one or more edge power contacts 608 to aid in final assembly. In one aspect, the one or more edge power contacts 608 may be folded over the captive fastener 622. In one aspect, the one or more edge power contacts 608 may be soldered, ultrasonically welded, or the like directly to the power substrate 606. The one or more edge power contacts 608 may have a metal plating, such as nickel, silver, gold, and/or the like to protect the surfaces and improve solder-ability.

In one aspect, a base 636 of the edge power contact 608 may be split into feet to aid in the attach process. The base 636 may have a metal plating, such as nickel, silver, and/or gold to protect the surfaces and improve solder-ability.

The power module 100 may further include one or more temperature sensors 610. The one or more temperature sensors 610 may be implemented with resistive temperature sensor elements attached directly to the power substrate 606.

Other types of temperature sensors are contemplated as well including resistance temperature detectors (RDTs) type sensors, Negative Temperature Coefficient (NTC) type sensors, optical type sensors, thermistors, thermocouples, and the like. The one or more temperature sensors 610 may be attached with solder, conductive epoxy, a silver sintering material, or the like, and then may be wire bonded to the signal interconnection assembly 616. The power module 100 may further include one or more diagnostic sensors that may include strain gauges sensing vibration, and the like. The diagnostic sensors can also determine humidity. Moreover, the diagnostic sensors may sense any environmental or device characteristic.

The power module 100 may further include housing sidewalls 612. The housing sidewalls 612 may be formed of a synthetic material. In one aspect, the housing sidewalls 612 may be an injection molded plastic element. The housing sidewalls 612 may provide electrical insulation, voltage creepage and clearance, structural support, and cavities for holding a voltage and moisture blocking encapsulation. In one aspect, the housing sidewalls 612 may be formed in an injection molding process with reinforced high temperature plastic.

The power module 100 may further include the center power contact 614. A surface of the center power contact 614 may form the V− terminal or second terminal 108. The center power contact 614 may create a high current path between an external system and the power devices 302. The center power contact 614 may be fabricated from sheet metal through an etching process, a stamping operation, or the like. The center power contact 614 may be isolated from the underlying power substrate 606 by being embedded in the housing sidewalls 612 (as illustrated) or may be soldered or welded to a secondary power substrate as described below. The center power contact 614 may include one or more apertures 632 as shown in FIG. 18 for receiving a corresponding fastener 634 that fastens the center power contact 614 to the housing sidewalls 612.

The low side switch position power devices 302 may be wire bonded 640 directly from their terminals to the center power contact 614 as illustrated in FIG. 18. The center power contact 614 may have a partial thickness bend assist line 624 to aid in folding at the final assembly stage. The center power contact 614 may have a metal plating, such as nickel, silver, gold, and/or the like to protect the surfaces and improve bond-ability.

The power module 100 may further include the signal interconnection assembly 616. The signal interconnection assembly may be a gate-source board. The signal interconnection assembly 616 may be a small signal circuit board facilitating electrical connection from the signal contacts to the power devices 302. The signal interconnection assembly 616 may allow for gate and source kelvin connection, as well as connection to additional nodes or internal sensing elements. The signal interconnection assembly 616 may allow for individual gate resistors for each of the power devices 302. The signal interconnection assembly 616 may be a printed circuit board, ceramic circuit board, flex circuit board, embedded metal strips, or the like arranged in the housing sidewalls 612. In one aspect, the signal interconnection assembly 616 may include a plurality assemblies. In one aspect, the signal interconnection assembly 616 may include a plurality assemblies, one for each switch position 104.

The power module 100 may further include the housing lid 618. The housing lid 618 may be a synthetic element. In one aspect, the housing lid 618 may be an injection molded plastic element. The housing lid 618 may provide electrical insulation, voltage creepage and clearance, and structural support. In this regard, the housing lid 618 together with the housing sidewalls 612 may form a closed assembly. The closed assembly may prevent the ingress of foreign materials from entering the interior of the power module 100. In one aspect, the housing lid 618 may be formed in an injection molding process with reinforced high temperature plastic.

The power module 100 may further include the fasteners 620. The fasteners 620 may be thread forming screws. Other types of fasteners are contemplated as well. The fasteners 620 may be used to screw directly into the housing sidewalls 612 to fasten down multiple elements in the power module 100. The fasteners 620 may be used for housing lid 618 attachment, signal interconnection assembly 616 attachment, embedding the center power contact 614 (if it is not embedded through another means), for fastening the housing sidewalls 612 to the base plate 602, and the like.

The power module 100 may further include the captive fasteners 622. The captive fasteners 622 may be hex nuts placed in the housing sidewalls 612 and housing lid 618 and may be held captive underneath the edge power contacts 608 and the center power contact 614 after they are folded over. Other types of fasteners or connectors are contemplated to implement the captive fasteners 622. The captive fasteners 622 may facilitate electrical connection to external buss bars or cables. The captive fasteners 622 may be arranged such that when the power module 100 is bolted to buss bars, the captive fasteners 622 and the edge power contacts 608 are pulled upwards into the bussing, forming a better quality electrical connection. If the captive fasteners 622 were affixed to the housing, they could act to pull the bussing down into the power module 100, which could form a poor connection due to the stiffness of the buss bars.

In one aspect, the housing lid 618 may include an aperture having a shape consistent with the external shape of the captive fasteners 622 to prevent the captive fasteners 622 from rotating. A corresponding fastener may be received by the captive fasteners 622. The corresponding fastener extending through a fastener hole 512 in the center power contact 614 to facilitate electrical connection to external buss bars or cables.

In one aspect, the housing sidewalls 612 may include an aperture having a shape consistent with the external shape of the captive fasteners 622 to prevent the captive fasteners 622 from rotating. A corresponding fastener may be received by the captive fasteners 622. The corresponding fastener extending through a fastener hole 512 in the one or more edge power contacts 608 to facilitate electrical connection to external buss bars or cables.

Referring back to FIG. 16A and FIG. 16B, a power terminal pin-out of a single half-bridge configuration of the power module 100 is depicted in FIG. 16A. The V+ terminal 106 and V− terminal 108 may be placed intentionally close together (with enough space for voltage clearances) to physically minimize the external current loop to the DC link capacitors.

The power module 100 may include signal terminals 502, 504, 506, 508. The specific pin-out of the signal terminals 502, 504, 506, 508 may be modular and may be modified as necessary. The configuration is illustrated in FIG. 16A. As shown, there are four pairs of signal pins for the signal terminals 502, 504, 506, 508 for differential signal transfer. Of course, any number of signal pins and any number of signal terminals may be implemented to provide the functionality as described in conjunction with the disclosure.

Each switch position 104 may utilize a pair of pins with the terminals 502, 504 for the gate signal and a source kelvin for optimal control. The other pin pairs of the signal terminals 506, 508 may be used for an internal temperature sensor, overcurrent sensing, or for other diagnostic signals. It is contemplated that more pins and/or more signal terminals may also be added to any of the rows if necessary, as long as they do not result in voltage isolation issues. In some aspects, the other diagnostic signals may be generated from diagnostic sensors that may include strain gauges sensing vibration, and the like. The diagnostic sensors can also determine humidity. Moreover, the diagnostic sensors may sense any environmental or device characteristic. The power module 100 may be implemented and/or configured in a number of different ways. For example, the power module 100 may include implementations having double-sided sintered devices that include two substrates, one on a front and one on a back on a semiconductor device.

In one aspect, one or more of the power modules 100 of FIGS. 17-24 may be inserted into an application, implemented with the application, configured with the application, or the like as a system having matched components as set forth by the disclosure. The application may be a system implementing one or more of the power modules 100 of FIGS. 17-24. The application may be a power system, a motor system, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, and electric vehicles (EVs), a converter, and the like.

Accordingly, the disclosure has provided and described a method and system that utilizes a device transfer curve of devices to determine characteristics of the device for improved matching of both static and dynamic parameters. Moreover, the disclosure has provided and described a method and system that may minimize derating and/or may maximize reliability by ensuring loss may be distributed equally among parallel devices reducing a tendency for thermal mismatch, runaway, and the like. Moreover, the disclosure has provided and described a method and system that may be utilized to deliver customer-matched components, such as power modules, which can be used to realize scalable architectures, such as power module architectures and/or multiple power modules operating in parallel.

Additionally, the disclosure has provided and described a multichip device implemented using a device transfer curve of devices to determine characteristics of the device for improved matching of both static and dynamic parameters. Moreover, the disclosure has provided and described a multichip device that may minimize derating and/or may maximize reliability by ensuring loss may be distributed equally among parallel devices reducing a tendency for thermal mismatch, runaway, and the like. Moreover, the disclosure has provided and described a multichip device, such as power modules, which can be used to realize scalable architectures, such as power module architectures and/or multiple power modules operating in parallel.

EXAMPLES

Example 1. A device binning and/or matching process comprising: measuring with a testing device currents and/or voltages of a device with respect to time; determining with the testing device binning and/or matching criteria for the device based on transfer data generated from the device currents and/or the voltages measured with respect to time; and outputting with the testing device the binning and/or matching criteria for the device.

Example 2. The device binning and/or matching process according to Example 1 further comprising applying with a testing device voltages and/or currents to a device, wherein the applying the voltages and/or the currents to the device comprises applying a gate voltage.

Example 3. The device binning and/or matching process according to any one or more of Examples 1-2 wherein the measuring the currents and/or voltages with respect to time comprises measuring a turn-on drain current of the device with respect to time.

Example 4. The device binning and/or matching process according to any one or more of Examples 1-3 wherein the measuring the currents and/or voltages with respect to time comprises measuring a gate-source voltage with respect to time.

Example 5. The device binning and/or matching process according to any one or more of Examples 1-4 wherein the measuring the currents and/or the voltages with respect to time comprises measuring a turn-on drain current of the device with respect to time and a gate-source voltage with respect to time.

Example 6. The device binning and/or matching process according to any one or more of Examples 1-5 wherein the transfer data comprises at least one of the following: a device transfer curve, a transfer function, and data representative of an independent scalar input versus a dependent scalar output.

Example 7. The device binning and/or matching process according to any one or more of Examples 1-6 wherein the determining binning and/or matching criteria based on the first device characterization comprises a current range.

Example 8. The device binning and/or matching process according to any one or more of Examples 1-7 wherein the determining binning and/or matching criteria further comprises determining secondary device characterization values; wherein the secondary device characterization values include at least one of the following: an anticipated implementation location of the device, an anticipated implementation temperature of the device, an anticipated implementation configuration of the device, an anticipated implementation voltage of the device, an anticipated implementation current of the device, an anticipated implementation environment of the device, an anticipated implementation humidity of the device, an anticipated number of the devices implemented, an anticipated implementation location of the device, and an anticipated implementation position of the device; and wherein the determining binning and/or matching criteria is based on the first device characterization and the secondary device characterization values.

Example 9. A system configured for device binning and/or matching comprising: at least one testing device configured to measure currents and/or voltages of a device with respect to time; the at least one testing device configured to determine binning and/or matching criteria for the device based on transfer data generated from the device currents and/or the voltages measured with respect to time; and the at least one testing device configured to output the binning and/or matching criteria for the device based on the transfer data.

Example 10. The system configured for device binning and/or matching according to Example 9 wherein an application of the voltages and/or the currents to the device comprises application of a gate voltage.

Example 11. The system configured for device binning and/or matching according to any one or more of Examples 9-10 wherein a measurement of the currents and/or the voltages with respect to time comprises a measurement of a turn-on drain current of the device with respect to time.

Example 12. The system configured for device binning and/or matching according to any one or more of Examples 9-11 wherein a measurement of the currents and/or the voltages with respect to time comprises a measurement of a gate-source voltage with respect to time.

Example 13. The system configured for device binning and/or matching according to any one or more of Examples 9-12 wherein a measurement of the currents and/or the voltages with respect to time comprises a measurement of a turn-on drain current of the device with respect to time and a gate-source voltage with respect to time.

Example 14. The system configured for device binning and/or matching according to any one or more of Examples 9-13 wherein the transfer data comprises at least one of the following: a device transfer curve, a transfer function, and data representative of an independent scalar input versus a dependent scalar output.

Example 15. The system configured for device binning and/or matching according to any one or more of Examples 9-14 wherein a determination of the binning and/or matching criteria based on the first device characterization comprises a current range.

Example 16. The system configured for device binning and/or matching according to any one or more of Examples 9-15 wherein a determination of the binning and/or matching criteria further comprises a determination of secondary device characterization values; wherein the secondary device characterization values include at least one of the following: an anticipated implementation location of the device, an anticipated implementation temperature of the device, an anticipated implementation configuration of the device, an anticipated implementation voltage of the device, an anticipated implementation current of the device, an anticipated implementation environment of the device, an anticipated implementation humidity of the device, an anticipated number of the devices implemented, an anticipated implementation location of the device, and an anticipated implementation position of the device; and wherein a determination of the binning and/or matching criteria is based on the first device characterization and the secondary device characterization values.

Example 17. A process of configuring a power module, comprising: providing at least one power substrate; arranging a housing on the at least one power substrate; selecting a plurality of power devices based on at least transfer data of the plurality of power devices; and electrically connecting the plurality of power devices to the at least one power substrate.

Example 18. The process of configuring a power module of Example 17, wherein the selecting the plurality of power devices based the first device characterization of each of the plurality of power devices based on at least the transfer data of the plurality of power devices further comprises: applying voltages and/or currents to each of the plurality of power devices; sweeping or varying application of voltages and/or currents to each of the plurality of power devices; measuring currents and/or voltages of each of the plurality of power devices with respect to time; generating the transfer data based on the currents and/or the voltages with respect to time of each of the plurality of power devices; selecting and comparing at least one operating point of the transfer data of the plurality of power devices; and determining binning and/or matching criteria for the plurality of power devices based on the transfer data.

Example 19. The process of configuring a power module of any one or more of Examples 17-18 wherein the applying the voltages and/or the currents to each of the plurality of power devices comprises applying a gate voltage.

Example 20. The process of configuring a power module of any one or more of Examples 17-19 wherein the measuring the currents and/or the voltages with respect to time of each of the plurality of power devices comprises measuring a turn-on drain current of each of the plurality of power devices with respect to time.

Example 21. The process of configuring a power module of any one or more of Examples 17-20 wherein the measuring the currents and/or the voltages with respect to time of each of the plurality of power devices comprises measuring a gate-source voltage with respect to time.

Example 22. The process of configuring a power module of any one or more of Examples 17-21 wherein the measuring the currents and/or the voltages with respect to time of each of the plurality of power devices comprises measuring a turn-on drain current of each of the plurality of power devices with respect to time and a gate-source voltage with respect to time of each of the plurality of power devices.

Example 23. The process of configuring a power module of any one or more of Examples 17-22 wherein the transfer data comprises at least one of the following: a device transfer curve, a transfer function, and data representative of an independent scalar input versus a dependent scalar output.

Example 24. The process of configuring a power module of any one or more of Examples 17-23 wherein the determining binning and/or matching criteria based on the first device characterization comprises a current range.

Example 25. The process of configuring a power module of any one or more of Examples 17-24 wherein the determining binning and/or matching criteria further comprises determining secondary device characterization values; wherein the secondary device characterization values include at least one of the following: an anticipated implementation location of each of the plurality of power devices, an anticipated implementation temperature of each of the plurality of power devices, an anticipated implementation configuration of each of the plurality of power devices, an anticipated implementation voltage of each of the plurality of power devices, an anticipated implementation current of each of the plurality of power devices, an anticipated implementation environment of each of the plurality of power devices, an anticipated implementation humidity of each of the plurality of power devices, an anticipated number of each of the plurality of power devices implemented, an anticipated implementation location of each of the plurality of power devices, and an anticipated implementation position of each of the plurality of power devices; and wherein the determining binning and/or matching criteria is based on the first device characterization and the secondary device characterization values.

Example 26. A power module, comprising: at least one electrically conductive power substrate; a housing arranged on the at least one electrically conductive power substrate; and a plurality of power devices arranged on and connected to the at least one electrically conductive power substrate, wherein each plurality of power devices comprise a first device characterization based on data characterizing both static and dynamic losses of each plurality of power devices within a predetermined range.

Example 27. The power module of Example 26, further comprising: a first terminal electrically connected to the at least one electrically conductive power substrate; a second terminal; a third terminal electrically connected to the at least one electrically conductive power substrate; and a base plate, wherein the first terminal comprises a contact surface located on the housing; wherein the second terminal comprises a contact surface located on the housing; and wherein the third terminal being electrically connected to at least one of the plurality of power devices.

Example 28. The power module of any one or more of Examples 26-27, wherein the data characterizing both static and dynamic losses of the plurality of power devices is based on: an application of voltages and/or currents to each of the plurality of power devices; an application of sweeping or varying of voltages and/or currents to each of the plurality of power devices; a measurement of currents and/or voltages of each of the plurality of power devices with respect to time; a generation of the data characterizing both static and dynamic losses based on the currents and/or the voltages with respect to time of each of the plurality of power devices; a selection and comparison of at least one operating point of the data characterizing both static and dynamic losses to obtain the first device characterization of each of the plurality of power devices; and a determination of binning and/or matching criteria for each of the plurality of power devices based on the first device characterization.

Example 29. The power module of any one or more of Examples 26-28, wherein the application of the voltages and/or the currents to each of the plurality of power devices comprises application of a gate voltage.

Example 30. The power module of any one or more of Examples 26-29, wherein the measurement of the currents and/or the voltages with respect to time of each of the plurality of power devices comprises a measurement of a turn-on drain current of each of the plurality of power devices with respect to time.

Example 31. The power module of any one or more of Examples 26-30, wherein the measurement of the currents and/or the voltages with respect to time of each of the plurality of power devices comprises a measurement of a gate-source voltage with respect to time.

Example 32. The power module of any one or more of Examples 26-31, wherein the measurement of the currents and/or the voltages with respect to time of each of the plurality of power devices comprises a measurement of a turn-on drain current of each of the plurality of power devices with respect to time and a gate-source voltage with respect to time of each of the plurality of power devices.

Example 33. The power module of any one or more of Examples 26-32, wherein the transfer data comprises at least one of the following: a device transfer curve, a transfer function, and data representative of an independent scalar input versus a dependent scalar output.

Example 34. The power module of any one or more of Examples 26-33, wherein the determination of the binning and/or matching criteria based on the first device characterization comprises a current range.

Example 35. The power module of any one or more of Examples 26-34, wherein the determination of the binning and/or matching criteria further comprises determining secondary device characterization values; wherein the secondary device characterization values include at least one of the following: an anticipated implementation location of each of the plurality of power devices, an anticipated implementation temperature of each of the plurality of power devices, an anticipated implementation configuration of each of the plurality of power devices, an anticipated implementation voltage of each of the plurality of power devices, an antici- pated implementation current of each of the plurality of power devices, an anticipated implementation environment of each of the plurality of power devices, an anticipated implementation humidity of each of the plurality of power devices, an anticipated number of each of the plurality of power devices implemented, an anticipated implementation location of each of the plurality of power devices, and an anticipated implementation position of each of the plurality of power devices; and wherein the determination of the binning and/or matching criteria is based on the first device characterization and the secondary device characterization values.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Additionally, the various aspects described may be implemented separately. Moreover, one or more the various aspects described may be combined. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

Aspects of the disclosure may be implemented in any type of computing devices, such as, e.g., a desktop computer, personal computer, a laptop/mobile computer, a personal data assistant (PDA), a mobile phone, a tablet computer, cloud computing device, and the like, with wired/wireless communications capabilities via the communication channels.

Further in accordance with various aspects of the disclosure, the methods described herein are intended for operation with dedicated hardware implementations including, but not limited to, PCs, PDAs, semiconductors, application specific integrated circuits (ASIC), programmable logic arrays, cloud computing devices, and other hardware devices constructed to implement the methods described herein.

It should also be noted that the software implementations of the disclosure as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the disclosure is considered to include a tangible storage medium or distribution medium, as listed herein and including art-recognized equivalents and successor media, in which the software implementations herein are stored.

Additionally, the various aspects of the disclosure may be implemented in a non-generic computer implementation. Moreover, the various aspects of the disclosure set forth herein improve the functioning of the system as is apparent from the disclosure hereof. Furthermore, the various aspects of the disclosure involve computer hardware that it specifically programmed to solve the complex problem addressed by the disclosure. Accordingly, the various aspects of the disclosure improve the functioning of the system overall in its specific implementation to perform the process set forth by the disclosure and as defined by the claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

What is claimed is:

1. A power module, comprising:
   at least one electrically conductive power substrate;
   a housing arranged on the at least one electrically conductive power substrate; and
   a plurality of power devices arranged on and connected to the at least one electrically conductive power substrate,
   wherein each plurality of power devices comprise a first device characterization based on data characterizing both static and dynamic losses of each plurality of power devices within a predetermined range.

2. The power module of claim 1, further comprising:
   a first terminal electrically connected to the at least one electrically conductive power substrate;
   a second terminal;
   a third terminal electrically connected to the at least one electrically conductive power substrate; and
   a base plate,
   wherein the first terminal comprises a contact surface located on the housing;
   wherein the second terminal comprises a contact surface located on the housing; and
   wherein the third terminal being electrically connected to at least one of the plurality of power devices.

3. The power module of claim 1,
   wherein the data characterizing both static and dynamic losses of the plurality of power devices is based on an application of voltages and/or currents to each of the plurality of power devices; and
   wherein the application of the voltages and/or the currents to each of the plurality of power devices comprises application of a gate voltage.

4. The power module of claim 1,
   wherein the data characterizing both static and dynamic losses of the plurality of power devices is based on a measurement of currents and/or voltages of each of the plurality of power devices with respect to time; and
   wherein the measurement of the currents and/or the voltages with respect to time of each of the plurality of power devices comprises a measurement of a turn-on drain current of each of the plurality of power devices with respect to time.

5. The power module of claim 1,
   wherein the data characterizing both static and dynamic losses of the plurality of power devices is based on a determination of binning and/or matching criteria for each of the plurality of power devices based on the first device characterization; and
   wherein the determination of the binning and/or matching criteria based on the first device characterization comprises a current range.

6. The power module of claim 1, wherein the data characterizing both static and dynamic losses of the plurality of power devices is based on at least one of the following:
   an application of voltages and/or currents to each of the plurality of power devices;
   an application of sweeping or varying of voltages and/or currents to each of the plurality of power devices;
   a measurement of currents and/or voltages of each of the plurality of power devices with respect to time;
   a generation of the data characterizing both static and dynamic losses based on the currents and/or the voltages with respect to time of each of the plurality of power devices;
   a selection and comparison of at least one operating point of the data characterizing both static and dynamic losses to obtain the first device characterization of each of the plurality of power devices; and a determination of binning and/or matching criteria for each of the plurality of power devices based on the first device characterization.

7. The power module of claim 6, wherein the measurement of the currents and/or the voltages with respect to time of each of the plurality of power devices comprises a measurement of a gate-source voltage with respect to time.

8. The power module of claim 6, wherein the measurement of the currents and/or the voltages with respect to time of each of the plurality of power devices comprises a measurement of a turn-on drain current of each of the plurality of power devices with respect to time and a gate-source voltage with respect to time of each of the plurality of power devices.

9. The power module of claim 6, wherein the data characterizing both static and dynamic losses comprises at least one of the following: a device transfer curve, a transfer function, and data representative of an independent scalar input versus a dependent scalar output.

10. A power module, comprising:
at least one electrically conductive power substrate;
a housing arranged on the at least one electrically conductive power substrate; and
a plurality of power devices arranged on and connected to the at least one electrically conductive power substrate,
wherein the plurality of power devices are selected based on transfer data of the plurality of power devices.

11. The power module of claim 10 wherein the transfer data comprises at least one of the following: a device transfer curve, a transfer function, and data representative of an independent scalar input versus a dependent scalar output.

12. The power module of claim 10 wherein the plurality of power devices are matched based on the transfer data of the plurality of power devices that comprises a current range.

13. The power module of claim 10 wherein the transfer data of the plurality of power devices varies less than 20%.

14. The power module of claim 10, further comprising:
a first terminal electrically connected to the at least one electrically conductive power substrate;
a second terminal;
a third terminal electrically connected to the at least one electrically conductive power substrate; and
a base plate,
wherein the first terminal comprises a contact surface located on the housing;
wherein the second terminal comprises a contact surface located on the housing; and
wherein the third terminal being electrically connected to at least one of the plurality of power devices.

15. A power module, comprising:
at least one electrically conductive power substrate;
a housing arranged on the at least one electrically conductive power substrate; and
a plurality of power devices arranged on and connected to the at least one electrically conductive power substrate,
wherein each plurality of power devices comprise a first device characterization based on data characterizing both static and dynamic losses of each plurality of power devices within a predetermined range; and
wherein the data characterizing both static and dynamic losses of the plurality of power devices is based on:
an application of voltages and/or currents to each of the plurality of power devices;
an application of sweeping or varying of voltages and/or currents to each of the plurality of power devices;
a measurement of currents and/or voltages of each of the plurality of power devices with respect to time;
a generation of the data characterizing both static and dynamic losses based on the currents and/or the voltages with respect to time of each of the plurality of power devices;
a selection and comparison of at least one operating point of the data characterizing both static and dynamic losses to obtain the first device characterization of each of the plurality of power devices; and
a determination of binning and/or matching criteria for each of the plurality of power devices based on the first device characterization.

16. The power module of claim 15, wherein the application of the voltages and/or the currents to each of the plurality of power devices comprises application of a gate voltage.

17. The power module of claim 15, wherein the measurement of the currents and/or the voltages with respect to time of each of the plurality of power devices comprises a measurement of a turn-on drain current of each of the plurality of power devices with respect to time.

18. The power module of claim 15, wherein the measurement of the currents and/or the voltages with respect to time of each of the plurality of power devices comprises a measurement of a gate-source voltage with respect to time.

19. The power module of claim 15, wherein the measurement of the currents and/or the voltages with respect to time of each of the plurality of power devices comprises a measurement of a turn-on drain current of each of the plurality of power devices with respect to time and a gate-source voltage with respect to time of each of the plurality of power devices.

20. The power module of claim 15, wherein the data characterizing both static and dynamic losses comprises at least one of the following: a device transfer curve, a transfer function, and data representative of an independent scalar input versus a dependent scalar output.

21. The power module of claim 15, wherein the determination of the binning and/or matching criteria based on the first device characterization comprises a current range.

22. The power module of claim 15, wherein the determination of the binning and/or matching criteria further comprises determining secondary device characterization values;
wherein the secondary device characterization values include at least one of the following: an anticipated implementation location of each of the plurality of power devices, an anticipated implementation temperature of each of the plurality of power devices, an anticipated implementation configuration of each of the plurality of power devices, an anticipated implementation voltage of each of the plurality of power devices, an anticipated implementation current of each of the plurality of power devices, an anticipated implementation environment of each of the plurality of power devices, an anticipated implementation humidity of each of the plurality of power devices, an anticipated number of each of the plurality of power devices implemented, an anticipated implementation location of each of the plurality of power devices, and an anticipated implementation position of each of the plurality of power devices; and
wherein the determination of the binning and/or matching criteria is based on the first device characterization and the secondary device characterization values.

* * * * *